US012601970B2

(12) United States Patent
Yotsuyanagi et al.

(10) Patent No.: US 12,601,970 B2
(45) Date of Patent: Apr. 14, 2026

(54) PHOTOSENSITIVE RESIN COMPOSITION, METHOD FOR MANUFACTURING PATTERNED CURED PRODUCT, CURED PRODUCT, INTERLAYER INSULATING FILM, COVER COAT LAYER, SURFACE PROTECTIVE FILM, AND ELECTRONIC COMPONENT

(71) Applicant: HD MICROSYSTEMS, LTD., Tokyo (JP)

(72) Inventors: Hiroko Yotsuyanagi, Hitachi (JP); Daisaku Matsukawa, Hitachi (JP); Noriyuki Yamazaki, Hitachi (JP)

(73) Assignee: HD MICROSYSTEMS, LTD., Tokyo (JP)

( * ) Notice: Subject to any disclaimer, the term of this patent is extended or adjusted under 35 U.S.C. 154(b) by 716 days.

(21) Appl. No.: 17/282,457

(22) PCT Filed: Jun. 17, 2019

(86) PCT No.: PCT/JP2019/023925
§ 371 (c)(1),
(2) Date: Apr. 2, 2021

(87) PCT Pub. No.: WO2020/070924
PCT Pub. Date: Apr. 9, 2020

(65) Prior Publication Data
US 2021/0382391 A1 Dec. 9, 2021

(30) Foreign Application Priority Data
Oct. 3, 2018 (JP) ................................ 2018-188703

(51) Int. Cl.
*G03F 7/037* (2006.01)
*G03F 7/031* (2006.01)

(52) U.S. Cl.
CPC .............. *G03F 7/037* (2013.01); *G03F 7/031* (2013.01)

(58) Field of Classification Search
CPC ........................................................ G03F 7/027
See application file for complete search history.

(56) References Cited

U.S. PATENT DOCUMENTS 6,083,657 A * 7/2000 Kono .................... G03F 7/0236 430/326
2013/0076458 A1* 3/2013 Katou ...................... B32B 1/06 430/283.1
2015/0205203 A1 7/2015 Fujiwara et al.
(Continued)

FOREIGN PATENT DOCUMENTS

CN 104428713 A 3/2015
CN 105378615 A 3/2016
(Continued)

OTHER PUBLICATIONS

Machine translation of JP2016199662A (Year: 2016).*

*Primary Examiner* — Ian A Rummel
(74) *Attorney, Agent, or Firm* — FITCH, EVEN, TABIN & FLANNERY, LLP

(57) ABSTRACT

A photosensitive resin composition comprising (A) a polyimide precursor having a polymerizable unsaturated bond; (B) a polymerizable monomer; (C) a photopolymerization initiator; and (D) an ultraviolet absorber.

19 Claims, 1 Drawing Sheet

(56) References Cited

U.S. PATENT DOCUMENTS

| | | | | |
|---|---|---|---|---|
| 2015/0291725 | A1* | 10/2015 | Nakamura | C08F 290/067 522/42 |
| 2015/0337116 | A1* | 11/2015 | Ono | C08G 73/1039 522/39 |
| 2016/0161847 | A1 | 6/2016 | Araki et al. | |
| 2017/0329220 | A1* | 11/2017 | Kato | C08L 63/04 |

FOREIGN PATENT DOCUMENTS

| | | | |
|---|---|---|---|
| JP | 2008-070897 | A | 3/2008 |
| JP | 2009-037232 | A | 2/2009 |
| JP | 2009-265520 | A | 11/2009 |
| JP | 2010-117614 | A | 5/2010 |
| JP | 2015-219491 | A | 12/2015 |
| JP | 2016-199662 | A | 12/2016 |
| JP | 2018-084626 | A | 5/2018 |
| KR | 10-2017-0088819 | A | 8/2017 |
| WO | 2008/111470 | A1 | 9/2008 |
| WO | 2014/097595 | A1 | 6/2014 |
| WO | 2015/052885 | A1 | 4/2015 |
| WO | 2019/058882 | A1 | 3/2019 |

* cited by examiner

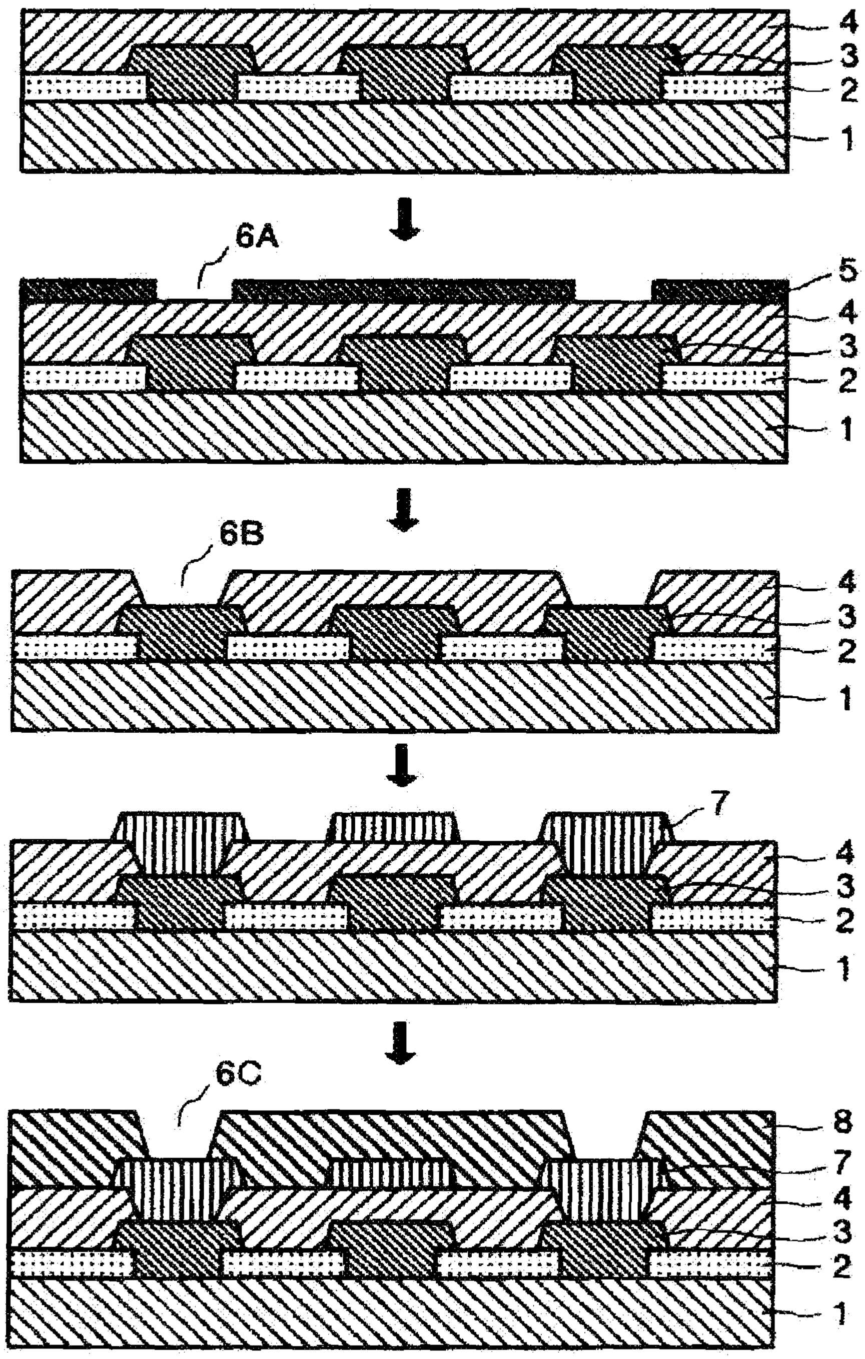
4
3
2
1
6A
5
4
3
2
1
6B
4
3
2
1
7
4
3
2
1
6C
8
7
4
3
2
1

PHOTOSENSITIVE RESIN COMPOSITION, METHOD FOR MANUFACTURING PATTERNED CURED PRODUCT, CURED PRODUCT, INTERLAYER INSULATING FILM, COVER COAT LAYER, SURFACE PROTECTIVE FILM, AND ELECTRONIC COMPONENT

CROSS-REFERENCE TO RELATED APPLICATIONS

This application is a U.S. national phase application filed under 35 U.S.C. § 371 of International Application No. PCT/JP2019/023925, filed Jun. 17, 2019, designating the United States, which claims priority from Japanese Application No. 2018-188703, filed Oct. 3, 2018, which are hereby incorporated herein by reference in their entirety.

TECHNICAL FIELD

The invention relates to a photosensitive resin composition, a method for manufacturing a patterned cured product, a cured product, an interlayer insulating film, a cover coat layer, a surface protective film, and an electronic component.

BACKGROUND ART

Hitherto, polyimides and polybenzoxazoles having excellent heat resistance, electrical characteristics, mechanical characteristics, and the like at the same time have been used for the surface protective film and the interlayer insulating film of the semiconductor element. In recent years, a photosensitive resin composition in which photosensitive characteristics are imparted to the resins itself has been used, and by using this photosensitive resin composition, the manufacturing process of a patterned cured product can be simplified, and complicated manufacturing processes can be shortened (for example, see Patent Document 1).

Incidentally, in recent years, the miniaturization of transistors which has supported the enhancement of the performance of computers has come to the limit of scaling law, and a laminated device structure in which semiconductor elements are three-dimensionally laminated for further enhancement of the performance and speeding up has attracted attention.

Among the laminated device structures, the multi-die fan-out wafer level package (Multi-die Fanout Wafer Level Packaging) is a package that collectively seals a plurality of dies in one package, and has attracted much attention because it can be expected to have lower costs and higher performance than conventionally proposed fan-out wafer level packages (manufactured by sealing one die in one package).

In manufacturing a multi-die fan-out wafer level package, low-temperature curing is strongly required from the viewpoint of protecting a high-performance die, protecting a sealing material having low heat resistance, and increasing yield (for example, see Patent Documents 2 to 4).

RELATED ART DOCUMENTS

Patent Documents

[Patent Document 1] JP2009-265520
[Patent Document 2] WO2008/111470
[Patent Document 3] JP2016-199662
[Patent Document 4] WO2015/052885

SUMMARY OF THE INVENTION

It is an object of the invention to provide a photosensitive resin composition capable of forming a cured product having excellent resolution and aspect ratio even when cured at a low temperature of 200° C. or less, a method for manufacturing a patterned cured product, a cured product, an interlayer insulating film, a cover coat layer, a surface protective film, and an electronic component.

There is a demand for miniaturization and high integration in electronic apparatus field. Based on this demand, the inventors realized that the problem was to increase the resolution of the patterned cured film, which is formed by heating and curing the patterned resin film.

In view of the above problem, as a result of extensive studies, the inventors found that a cured product of a patterned cured film having excellent resolution can be formed by using a combination of specific components as a photosensitive resin composition, and completed the invention.

According to the invention, the following photosensitive resin composition and the like are provided.

1. A photosensitive resin composition comprising:
   (A) a poilyimide precursor having a polymerizable unsaturated bond;
   (B) a polymerizable monomer;
   (C) a photopolymerization initiator; and
   (D) an ultraviolet absorber.
2. The photosensitive resin composition according to 1, wherein the component (A) is a polyimide precursor having a structural unit represented by the following formula (1):

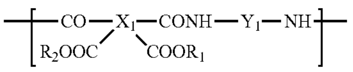

(1)

wherein in the formula (1), $X_1$ is a tetravalent group having one or more aromatic groups; a —$COOR_1$ group and a —CONH— group are on the ortho-position to each other; a —$COOR_2$ group and a —CO— group are on the ortho-position to each other; $Y_1$ is a divalent group having one or more aromatic groups; $R_1$ and $R_2$ are independently a hydrogen atom, a group represented by the following formula (2), or an aliphatic hydrocarbon group including 1 to 4 carbon atoms; provided that at least one of $R_1$ and $R_2$ is the group represented by the formula (2):

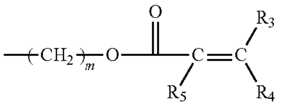

(2)

wherein in the formula (2), $R_3$ to $R_5$ are independently a hydrogen atom or an aliphatic hydrocarbon group including 1 to 3 carbon atoms; and m is an integer of 1 to 10.

3. The photosensitive resin composition according to 1 or 2, wherein the component (B) comprises a polymerizable monomer having a group comprising a polymerizable unsaturated double bond.

4. The photosensitive resin composition according to 3, wherein the polymerizable monomer has two or more groups comprising the polymerizable unsaturated double bond.

5. The photosensitive resin composition according to any one of 1 to 4, wherein the polymerizable monomer has an aliphatic cyclic skeleton.

6. The photosensitive resin composition according to any one of 1 to 3, wherein the component (B) comprises a polymerizable monomer represented by the following formula (3):

(3)

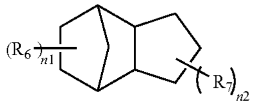

wherein in the formula (3), $R_6$ and $R_7$ are independently an aliphatic hydrocarbon group including 1 to 4 carbon atoms, or a group represented by the following formula (4); n1 is an integer of 0 or 1; n2 is an integer of 0 to 2; provided that n1+n2 is 1 or more; and at least one of the n1 $R_6$'s and the n2 $R_7$'s is a group represented by the following formula (4):

(4)

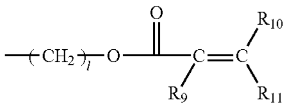

wherein in the formula (4), $R_9$ to $R_{11}$ are independently a hydrogen atom, or an aliphatic hydrocarbon group including 1 to 3 carbon atoms; and l is an integer of 0 to 10.

7. The photosensitive resin composition according to 6, wherein n1+n2 is 2 or 3.

8. The photosensitive resin composition according to any one of 1 to 7, wherein the component (B) comprises a polymerizable monomer represented by the following formula (5):

(5)

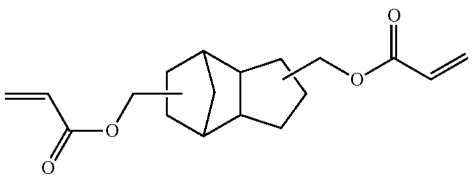

9. The photosensitive resin composition according to 1 to 8, wherein the component (D) has an absorbance at 365 nm of 0.1 or more at the concentration of 10 mg/L.

10. The photosensitive resin composition according to 1 to 9, wherein the component (D) is one or more selected from the group consisting of benzotriazole-based compounds, benzophenone-based compounds, azobenzene-based compounds, and polyphenol-based compounds.

11. The photosensitive resin composition according to 1 to 10, wherein the component (D) is one or more selected from the group consisting of 2-(2H-benzotriazol-2-yl)-4-(1,1,3,3-tetramethylbutyl)phenol, 2-(2H-benzotriazol-2-yl)-4,6-bis(1-methyl-1-phenylethyl) phenol, 2-(2H-benzotriazol-2-yl)-p-cresol, 2,2',4,4'-tetrahydroxybenzophenone, 2,2'-dihydroxy-4,4'-dimethoxybenzophenone, 4-[ethyl(2-hydroxyethyl) amino]4'-nitroazobenzene, (1E,6E)-1,7-bis(4-hydroxy-3-methoxyphenyl)-1,6-heptadiene-3,5-dione, and 1,7-bis(4-hydroxyphenyl)-1,6-heptadiene-3,5-dione.

12. The photosensitive resin composition according to any one of 1 to 11, further comprising (I) a thermal polymerization initiator.

13. A method for producing a patterned cured product comprising:

applying a photosensitive resin composition according to any one of 1 to 12 on a substrate, followed by drying to form a photosensitive resin film;

pattern-exposing the photosensitive resin film to obtain a resin film;

developing the resin film having undergone the pattern exposure using an organic solvent to obtain a patterned resin film; and heat-treating the patterned resin film.

14. The method for manufacturing a patterned cured product according to 13, wherein a temperature of the heat treatment is 200° C. or lower.

15. A cured product obtained by curing a photosensitive resin composition according to any one of 1 to 12.

16. The cured product according to 15, which is a patterned cured product.

17. An interlayer insulating film, a cover coat layer, or a surface protective film manufactured by using a cured product according to 15 or 16.

18. An electronic component comprising an interlayer insulating film, a cover coat layer, or a surface protective film according to 17.

According to the invention, a photosensitive resin composition capable of forming a cured product having excellent resolution and aspect ratio even when cured at a low-temperature of 200° C. or lower, a method for manufacturing a patterned cured product, a cured product, an interlayer insulating film, a cover coat layer, a surface protective film, and an electronic component, can be provided.

BRIEF DESCRIPTION OF THE DRAWINGS

FIG. 1 is a manufacturing process diagram of an electronic component according to an embodiment of the invention.

MODE FOR CARRYING OUT THE INVENTION

Embodiments of a photosensitive resin composition of the invention, a method for manufacturing a patterned cured product using the photosensitive resin composition, a cured product, an interlayer insulating film, a cover coat layer, a surface protective film, and an electronic component will be described below in detail. The invention is not limited to the following embodiments.

In the specification, "A or B" means that either of A and B may be included, or both of A and B may be included. Moreover, the term "step" herein includes not only a step independent from other steps but also a step although it cannot be clearly distinguished from the other steps, but it can achieve the expected action.

A numerical value range represented by using "to" indicates a range including numerical values described before and after "to" as the minimum value and the maximum value, respectively. Moreover, when a plurality of materials corresponding to each component exist in a composition, unless otherwise specified, the content of each component in the composition herein means the total amount of the plurality of materials existing in the composition. Further, unless otherwise specified, materials listed as examples may be used alone or in combination of two or more.

The term "(meth)acrylic group" herein means an "acrylic group" and a "methacrylic group".

The photosensitive resin composition of the invention contains (A) a polyimide precursor having a polymerizable unsaturated bond (hereinafter also referred to as "component (A)"), (B) a polymerizable monomer (hereinafter also referred to as "component (B)"), (C) a photopolymerization initiator (hereinafter also referred to as "component (C)"), and (D) an ultraviolet absorber (hereinafter also referred to as "component (D)").

By the photosensitive resin composition of the invention, a cured product having excellent resolution and aspect ratio can be formed even when cured at a low temperature of 200° C. or lower.

The photosensitive resin composition of the invention is preferably a negative photosensitive resin composition.

Further, it is preferable that the photosensitive resin composition of the invention be material for an electronic component.

The component (A) is not particularly limited, but a polyimide precursor having high transmittance when i-ray is used as a light source during patterning and exhibiting high curing property even when cured at a low temperature of 200° C. or lower is preferable.

Examples of the polymerizable unsaturated bond include a carbon-carbon double bond and the like.

The component (A) is preferably a polyimide precursor having a structural unit represented by the following formula (1). By using such a polyimide precursor, a cured product having a high i-ray transmittance and a satisfactory curing property can be formed even when cured at a low temperature of 200° C. or lower.

The content of the structural unit represented by the formula (1) is preferably 50 mol % or more, more preferably 80 mol % or more, and still more preferably 90 mol % or more, based on the total moles of the structural units in the component (A). The upper limit is not particularly limited, and may be 100 mol %.

(1)

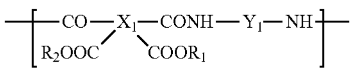

In the formula (1), $X_1$ is a tetravalent group having one or more aromatic groups; a —$COOR_1$ group and a —CONH— group are on the ortho-position to each other; a —$COOR_2$ group and a —CO— group are on the ortho-position to each other; $Y_1$ is a divalent group having one or more aromatic groups; $R_1$ and $R_2$ are independently a hydrogen atom, a group represented by the following formula (2), or an aliphatic hydrocarbon group including 1 to 4 carbon atoms (preferably 1 or 2 carbon atoms); provided that at least one of $R_1$ and $R_2$ is the group represented by the formula (2).

(2)

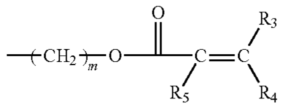

In the formula (2), $R_3$ to $R_5$ are independently a hydrogen atom or an aliphatic hydrocarbon group including 1 to 3 carbon atoms; and m is an integer of 1 to 10 (preferably an integer of 2 to 5, and more preferably 2 or 3).

In the tetravalent group having one or more (preferably 1 to 3, and more preferably 1 or 2) aromatic group for $X_1$ in the formula (1), the aromatic group may be an aromatic hydrocarbon group or an aromatic heterocyclic group. An aromatic hydrocarbon group is preferred as the aromatic group.

Examples of the aromatic hydrocarbon group for $X_1$ in the formula (1) include: a divalent to tetravalent (divalent, trivalent, or tetravalent) group derived from a benzene ring; a divalent to tetravalent group derived from naphthalene; a divalent to tetravalent group derived from perylene; and the like.

Examples of the tetravalent group having one or more aromatic groups for $X_1$ in the formula (1) include, but are not limited to, the following tetravalent groups of the formula (6).

(6)

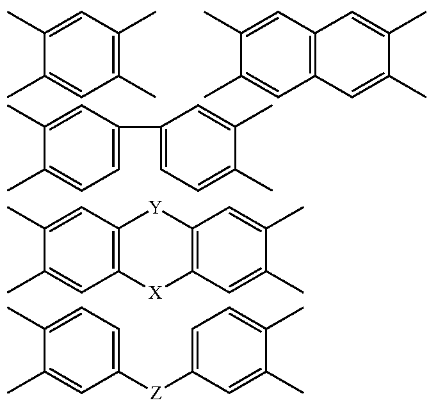

In the formula (6), X and Y independently represent a divalent group which is not conjugated to the benzene rings to which each is bonded, or a single bond; and Z is an ether group (—O—) or a sulfide group (—S—) (—O— is preferable).

In the formula (6), the divalent groups for X and Y which is not conjugated to the benzene rings to which each is bonded, are preferably —O—, —S—, a methylene group, a bis(trifluoromethyl)methylene group, or a difluoromethylene group, and more preferably —O—.

In the divalent group having one or more (preferably 1 to 3, and more preferably 1 or 2) aromatic group for $Y_1$ in the formula (1), the aromatic group may be an aromatic hydrocarbon group or an aromatic heterocyclic group. An aromatic hydrocarbon group is preferred.

Examples of the aromatic hydrocarbon group for $Y_1$ in the formula (1) include: a divalent to tetravalent group derived from a benzene ring; a divalent to tetravalent group derived from naphthalene; a divalent to tetravalent group derived from perylene; and the like.

Examples of the divalent group having one or more aromatic groups for $Y_1$ in the formula (1) include, but are not limited to, a divalent group in which, for example, two aromatic groups are bonded via an ether group (—O—).

Examples of the divalent group having one or more aromatic groups for $Y_1$ in the formula (1) include, but are not limited to, a divalent group represented by the following formula (7).

(7)

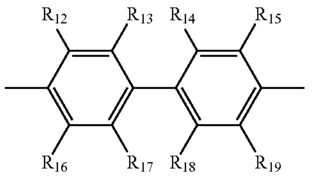

In the formula (7), $R_{12}$ to $R_{19}$ are independently a hydrogen atom, a monovalent aliphatic hydrocarbon group, or a monovalent organic group having a halogen atom.

Examples of the monovalent aliphatic hydrocarbon group (preferably having 1 to 10 carbon atoms, and more preferably having 1 to 6 carbon atoms) for $R_{12}$ to $R_{19}$ in the formula (7) include a methyl group and the like. For example, $R_{12}$ and $R_{15}$ to $R_{19}$ may be hydrogen atoms, and $R_{13}$ and $R_{14}$ may be monovalent aliphatic hydrocarbon groups.

As the monovalent organic group having a halogen atom (preferably a fluorine atom) for $R_{12}$ to $R_{19}$ in the formula (7), a monovalent aliphatic hydrocarbon group having a halogen atom (preferably including 1 to 10 carbon atoms, and more preferably including 1 to 6 carbon atoms) is preferable, and a trifluoromethyl group and the like are mentioned.

Examples of the aliphatic hydrocarbon group including 1 to 4 (preferably 1 or 2) carbon atoms for $R_1$ and $R_2$ in the formula (1) include a methyl group, an ethyl group, an n-propyl group, a 2-propyl group, an n-butyl group, and the like.

At least one of $R_1$ and $R_2$ in the formula (1) is a group represented by the formula (2), and both are preferably groups represented by the formula (2).

Examples of the aliphatic hydrocarbon group including 1 to 3 (preferably 1 or 2) carbon atoms for $R_3$ to $R_5$ in the formula (2) include a methyl group, an ethyl group, an n-propyl group, a 2-propyl group, and the like. A methyl group is preferable.

The polyimide precursor having the structural unit represented by the formula (1) can be obtained by, for example, reacting a tetracarboxylic dianhydride represented by the following formula (8) and a diamino compound represented by the following formula (9) in an organic solvent such as N-methyl-2-pyrrolidone to obtain a polyamic acid, adding a compound represented by the following formula (10), and reacting in an organic solvent to partially introduce ester groups.

The tetracarboxylic dianhydride represented by the formula (8) and the diamino compound represented by the formula (9) may be used alone or in combination of two or more.

(8)

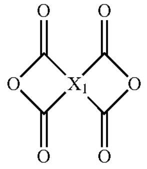

In the formula (8), $X_1$ is a group corresponding to $X_1$ of the formula (1).

$$H_2N—Y_1—NH_2 \quad (9)$$

In the formula (9), $Y_1$ is as defined in the formula (1).

$$R—OH \quad (10)$$

In the formula (10), R is a group represented by the formula (2).

The component (A) may have a structural unit other than the structural unit represented by the formula (1).

Examples of the structural unit other than the structural unit represented by the formula (1) include the structural unit represented by the following formula (11).

(11)

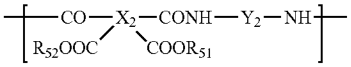

In the formula (11), $X_2$ is a tetravalent group having one or more aromatic groups; a —$COOR_{51}$ group and a —CONH— group are on the ortho-position to each other; a —$COOR_{52}$ group and a —CO— group are on the ortho-position to each other; $Y_2$ is a divalent group having one or more aromatic groups; and $R_{51}$ and $R_{52}$ are independently a hydrogen atom, or an aliphatic hydrocarbon group including 1 to 4 carbon atoms.

Examples of the tetravalent group having one or more aromatic groups for $X_2$ in the formula (11) include the same as the tetravalent groups having one or more aromatic groups for $X_1$ in the formula (1).

Examples of the divalent group having one or more aromatic groups for $Y_2$ in the formula (11) include the same as the divalent groups having one or more aromatic groups for $Y_1$ in the formula (1).

Examples of the aliphatic hydrocarbon group having 1 to 4 carbon atoms for $R_{51}$ and $R_{52}$ in the formula (11) include the same as the aliphatic hydrocarbon group having 1 to 4 carbon atoms for $R_1$ and $R_2$.

The structural unit other than the structural unit represented by the formula (1) may be used alone or in combination of two or more.

The content of the structural unit other than the structural unit represented by the formula (1) is preferably less than 50 mol %, based on the total moles of all the structural units in the component (A).

In the component (A), the ratio of the carboxy group esterified with the group represented by the formula (2) to the total moles of carboxy groups and carboxy esters is preferably 50 mol % or more, more preferably 60 to 100 mol %, and still more preferably 70 to 90 mol %.

The molecular weight of the component (A) is not particularly limited, but the weight-average molecular weight is preferably 10,000 to 200,000.

The weight average molecular weight can be measured by, for example, a gel permeation chromatography method, and can be calculated by conversion using a standard polystyrene calibration curve.

The photosensitive resin composition of the invention contains (B) a polymerizable monomer. By the component (B), the heat resistance, mechanical properties, and chemical resistance of the cured product to be formed can be increased.

From the viewpoint of increasing the crosslinking density with the component (A), the component (B) preferably contains a polymerizable monomer having (preferably 2 or more) polymerizable unsaturated double bonds (preferably (meth)acrylic groups, which can be polymerized by a photopolymerization initiator).

The polymerizable monomer preferably has an aliphatic cyclic skeleton (preferably including 4 to 15 carbon atoms, and more preferably including 5 to 12 carbon atoms). By using such a polymerizable monomer, hydrophobicity can be imparted to the cured product that can be formed, and a decrease in adhesion between the cured product and a substrate under high temperature and high humidity conditions can be suppressed.

It is preferable that the polymerizable monomer have two or three groups containing polymerizable unsaturated double bond in order to increase the crosslinking density and the photosensitivity and to suppress swelling of the pattern after development.

The component (B) preferably contains a polymerizable monomer represented by the following formula (3).

(3)

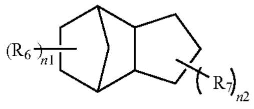

In the formula (3), $R_6$ and $R_7$ are independently an aliphatic hydrocarbon group including 1 to 4 carbon atoms, or a group represented by the following formula (4); n1 is 0 or 1; n2 is an integer of 0 to 2; n1+n2 is 1 or more (preferably 2 or 3); provided that at least one (preferably 2 or 3) of the n1 $R_6$'s and the n2 $R_7$'s is a group represented by the following formula (4).

When two $R_7$'s are present, the two $R_7$'s may be the same or different.

(4)

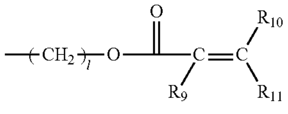

In the formula (4), $R_9$ to $R_{11}$ are independently a hydrogen atom, or an aliphatic hydrocarbon group including 1 to 3 carbon atoms; and l is an integer of 0 to 10 (preferably 0, 1 or 2).

It is more preferable that the component (B) contain a polymerizable monomer represented by the following formula (5).

(5)

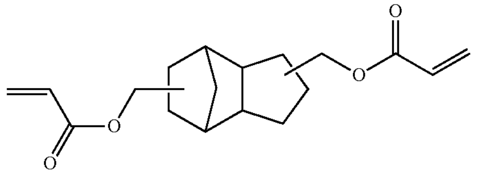

As the component (B), for example, the following polymerizable monomers may be used.

(12)

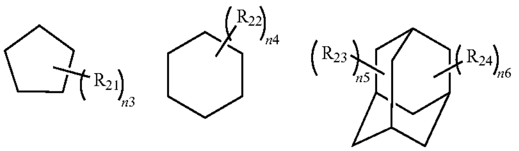

In the formula (12), $R_{21}$ to $R_{24}$ are independently an aliphatic hydrocarbon group including 1 to 4 carbon atoms, or a group represented by the formula (4); n3 is an integer of 1 to 3 (preferably 2 or 3); n4 is an integer of 1 to 3 (preferably 2 or 3); n5 is 0 or 1; n6 is 0 or 1; provided that n5+n6 is 1 or more (preferably 2).

When two or more $R_{21}$'s are present, two or more $R_{21}$'s may be the same or different.

When two or more $R_{22}$'s are present, two or more $R_{22}$'s may be the same or different.

At least one (preferably 2 or 3) of the n3 $R_{21}$'s is a group represented by the formula (4).

At least one (preferably 2 or 3) of the n4 $R_2$'s is a group represented by the formula (4).

At least one (preferably 2) of the n5 $R_{23}$'s and the n6 $R_{24}$'s is a group represented by the formula (4).

Examples of the aliphatic hydrocarbon group including 1 to 4 carbon atoms for $R_6$ and $R_7$ in the formula (3) and $R_{21}$ to $R_{24}$ in the formula (12) include the same as the aliphatic hydrocarbon group including 1 to 4 carbon atoms for $R_1$ and $R_2$ in the formula (1).

Examples of the aliphatic hydrocarbon group including 1 to 3 carbon atoms for $R_9$ to $R_{11}$ in the formula (4) include the same as the aliphatic hydrocarbon group including 1 to 3 carbon atoms for $R_3$ to $R_5$ in the formula (2).

As the component (B), a polymerizable monomer other than the polymerizable monomer having an aliphatic cyclic skeleton may be used. Examples of the polymerizable monomer other than the polymerizable monomer having an aliphatic cyclic skeleton include diethylene glycol diacrylate, triethylene glycol diacrylate, tetraethylene glycol diacrylate, diethylene glycol dimethacrylate, triethylene glycol dimethacrylate, tetraethylene glycol dimethacrylate, 1,4-butanediol diacrylate, 1,6-hexanediol diacrylate, 1,4-butanediol dimethacrylate, 1,6-hexanediol dimethacrylate, and the like.

Examples thereof also include trimethylolpropane diacrylate, trimethylolpropane triacrylate, trimethylolpropane dimethacrylate, trimethylolpropane trimethacrylate, pentaerythritol triacrylate, pentaerythritol tetraacrylate, pentaerythritol trimethacrylate, pentaerythritol tetramethacrylate, tetramethylolmethanetetraacrylate, tetramethylolmethanetetraacrylate, dipentaerythritol hexaacrylate, dipentaerythritol hexamethacrylate, tetrakis acrylic acid methanetetrayltetrakis(methyleneoxyethylene) ester, ethoxylated isocyanuric acid triacrylate, ethoxylated isocyanuric acid trimethacrylate, acryloyloxyethyl isocyanurate, methacryloyloxyethyl isocyanurate, and the like.

Among these, tetraethylene glycol dimethacrylate, pentaerythritol tetraacrylate, and tetrakis acrylic acid methanetetrayltetrakis(methyleneoxyethylene) ester are preferred.

The component (B) may be used alone or in combination of two or more.

The content of the component (B) is preferably 1 to 50 parts by mass with respect to 100 parts by mass of the component (A). From the viewpoint of increasing the hydrophobicity of the cured product, it is more preferably 3 to 50 parts by mass, and still more preferably 5 to 40 parts by mass.

Within the above range, a practical relief pattern is easily obtained, and residue generated from unexposed portions after the development is easily suppressed.

Examples of the component (C) preferably include, but not limited to, for example, benzophenone derivatives such as benzophenone, methyl 2-benzoylbenzoate, 4-benzoyl-4'-methyldiphenyl ketone, dibenzyl ketone, and fluorenone;

acetophenone derivatives such as 2,2'-diethoxyacetophenone, 2-hydroxy-2-methylpropiophenone, and 1-hydroxycyclohexylphenyl ketone;

thioxanthone derivatives such as thioxanthone, 2-methylthioxanthone, 2-isopropylthioxanthone, and diethylthioxanthone;

benzyl derivatives such as benzyl, benzyl dimethyl ketal, and benzyl-p-methoxyethyl acetal;

benzoin derivatives such as benzoin and benzoin methyl ether; and oxime esters such as 1-phenyl-1,2-butanedione-2-(o-methoxycarbonyl) oxime, 1-phenyl-1,2-propanedione-2-(o-methoxycarbonyl) oxime, 1-phenyl-1,2-propanedione-2-(o-ethoxycarbonyl) oxime, 1-phenyl-1,2-propanedione-2-(o-benzoyl) oxime, 1,3-diphenylpropanetrione-2-(o-ethoxycarbonyl) oxime, 1-phenyl-3-ethoxypropanetrione-2-(o-benzoyl) oxime, ethanone, 1-[9-ethyl-6-(2-methylbenzoyl)-9H-carbazol-3-yl], 1-(O-acetyloxime), and a compound represented by the following formula; and the like.

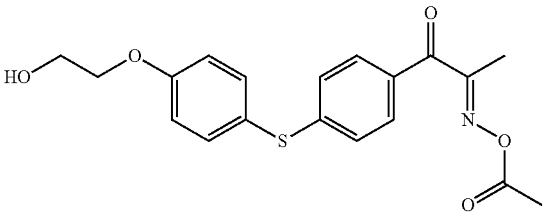 [SMILES: CC(=O)O/N=C(\C)C(=O)c1ccc(Sc2ccc(OCCO)cc2)cc1]

In particular, oxime esters are preferable from the viewpoint of photosensitivity.

It is preferable that the component (C) contains (C1) one or more compounds selected from the group consisting of a compound represented by the following formula (15-1) and a compound represented by the following formula (15-2) (hereinafter, also referred to as "component (C1)").

The component (C1) preferably has sensitivity to active light higher than that of the component (C2) described later, and is preferably a high-sensitivity photosensitive agent.

(15-1)

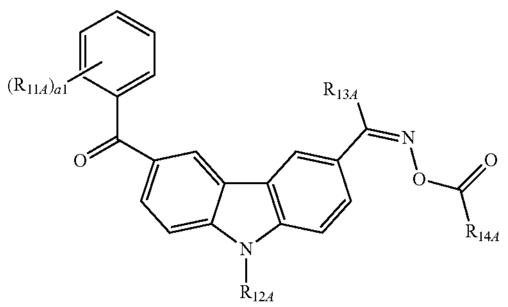

In the formula (15-1), $R_{11A}$ is an alkyl group including 1 to 12 carbon atoms, and a1 is an integer of 0 to 5; $R_{12A}$ is a hydrogen atom or an alkyl group including 1 to 12 carbon atoms; $R_{13A}$ and $R_{14A}$ independently represent a hydrogen atom, an alkyl group including 1 to 12 carbon atoms (preferably 1 to 4 carbon atoms), a phenyl group, or a tolyl group; and when a1 is an integer of 2 or more, $R_{11A}$ 's may be the same as or different from each other.

$R_{11A}$ is preferably an alkyl group including 1 to 4 carbon atoms, and more preferably a methyl group. a1 is preferably 1. $R_{12A}$ is preferably an alkyl group including 1 to 4 carbon atoms, and more preferably an ethyl group. $R_{13A}$ and $R_{14A}$ are preferably independently an alkyl group including 1 to 4 carbon atoms, and more preferably a methyl group.

Examples of the compound represented by the formula (15-1) include, for example, a compound represented by the following formula (15A), which is available as "IRGACURE OXE 02" manufactured by BASF Japan Ltd.

(15A)

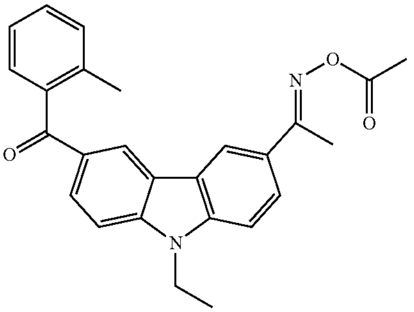

(15-2)

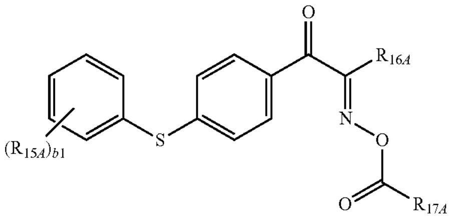

In the formula (15-2), $R_{15A}$ is —OH, —COOH, —$C(CH_2)OH$, —$O(CH_2)_2OH$, —$COO(CH_2)OH$, or —$COO(CH_2)_2OH$; $R_{16A}$ and $R_{17A}$ are independently a hydrogen atom, an alkyl group including 1 to 12 carbon atoms (preferably including 1 to 6 carbon atoms), a cycloalkyl group including 4 to 10 carbon atoms, a phenyl group, or a tolyl group; b1 is an integer of 0 to 5; and when b1 is an integer of 2 or more, $R_{15}$'s may be the same as or different from each other.

$R_{15A}$ is preferably —$O(CH_2)_2OH$. b1 is preferably 0 or 1. Ria is preferably an alkyl group including 1 to 6 carbon atoms, and more preferably a methyl group or a hexyl group. $R_{17A}$ is preferably an alkyl group including 1 to 6 carbon atoms or a phenyl group, and more preferably a methyl group or a phenyl group.

Examples of the compound represented by the formula (15-2) include a compound represented by the following formula (158), which is available as "NCI-930" manufactured by ADEKA CORPORATION.

(15B)

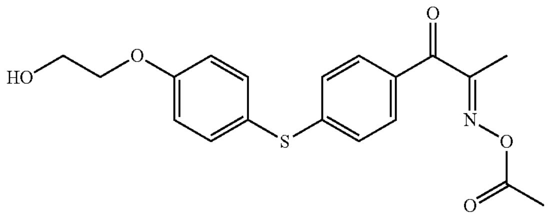

Further, it is preferable that the component (C) contain (C2) a compound represented by the following formula (16) (hereinafter, also referred to as "component (C2)").

The component (C2) preferably has sensitivity to active light lower than that of the component (C1), and is preferably a standard-sensitivity photosensitive agent.

(16)

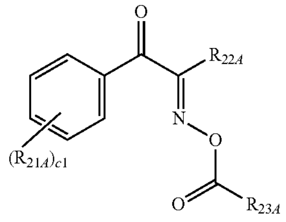

In the formula (16), $R_{21A}$ is an alkyl group including 1 to 12 carbon atoms, $R_{22A}$ and $R_{23A}$ are independently a hydrogen atom, an alkyl group including 1 to 12 carbon atoms (preferably 1 to 4 carbon atoms), an alkoxy group including 1 to 12 carbon atoms (preferably 1 to 4 carbon atoms), a cycloalkyl group including 4 to 10 carbon atoms, a phenyl group or a tolyl group, and c1 is an integer of 0 to 5; and when c1 is an integer of 2 or more, $R_{21A}$'s may be the same as or different from each other.

c1 is preferably 0. $R_{21A}$ is preferably an alkyl group including 1 to 4 carbon atoms, and more preferably a methyl group. $R_{23A}$ is preferably an alkoxy group including 1 to 12 carbon atoms, more preferably an alkoxy group including 1 to 4 carbon atoms, and still more preferably a methoxy group or an ethoxy group.

Examples of the compound represented by the formula (16) include a compound represented by the following formula (16A), which is available as "G-1820 (PDO)" manufactured by Lambson Co., Ltd.

(16A)

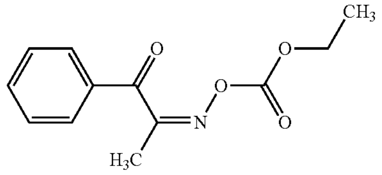

The component (C) may be used alone or in combination of 2 or more.

The component (C) preferably contains one or more selected from the group consisting of the component (C1) and the component (C2).

In addition, it is preferable that the component (C) contains the component (C1) and the component (C2) from the viewpoint of adjusting the transmittance.

The content of the component (C) is preferably from 0.1 to 20 parts by mass, more preferably from 0.1 to 15 parts by mass, and still more preferably from 0.1 to 10 parts by mass with respect to 100 parts by mass of the component (A).

Within the above range, the photocrosslink tends to be uniform in the film thickness direction, and a practical relief pattern can be easily obtained.

When the component (C1) is contained, the content of the component (C1) is usually 0.05 to 5.0 parts by mass, preferably 0.1 to 2.5 parts by mass, and more preferably 0.2 to 2.0 parts by mass, based on 100 parts by mass of the component (A).

When the component (C2) is contained, the content of the component (C2) is usually 0.5 to 15.0 parts by mass, and preferably 1.0 to 10.0 parts by mass, based on 100 parts by mass of the component (A).

When the component (C1) and the component (C2) are contained, it is preferable that the content of the component (C1) be 0.05 to 5.0 parts by mass based on 100 parts by mass of the component (A), and the content of the component (C2) be 0.5 to 15.0 parts by mass based on 100 parts by mass of the component (A).

When the component (C1) and the component (C2) are contained, the mass ratio of the content of the component (C1) and the component (C2) is preferably 1:3 to 1:70, and more preferably 1:5 to 1:50.

The photosensitive resin composition of the invention contains (D) an ultraviolet absorber.

By using the component (D), cross-linking of unexposed portions due to diffuse reflection of active light at the time of irradiation is suppressed. The component (D) preferably has an absorbance at 365 nm of 0.05 or more, and more preferably 0.1 or more, at a concentration of 10 mg/L.

Examples of the component (D) include, for example, benzotriazole-based compounds such as 2-(2-hydroxy-5-methylphenyl)-2H-benzotriazole, 2-(3-tert-butyl-2-hydroxy-5-methylphenyl)-5-chloro-2H-benzotriazole, 2-(3,5-di-tert-pentyl-2-hydroxyphenyl)-2H-benzotriazole, 2-(2H-benzotriazol-2-yl)-4-methyl-6-(3,4,5,6-tetrahydrophthalimidylmethyl)phenol, 2-(2-hydroxy-4-octyloxyphenyl)-2H-benzotriazole, 2-(2-hydroxy-5-tert-octylphenyl)-2H-benzotriazole, 2-(2H-benzotriazol-2-yl)-4-(1,1,3,3-tetramethylbutyl)phenol, 2-(2H-benzotriazol-2-yl)-4,6-bis(1-methyl-1-phenylethyl)phenol, and 2-(2H-benzotriazol-2-yl)-p-cresol);

salicylic acid ester-based compounds such as phenyl salicylate, and 4-tert-butyl phenyl salicylate;

benzophenone-based compounds such as 2,4-dihydroxybenzophenone, 2-hydroxy-4-methoxybenzophenone, 2-hydroxy-4-n-octyloxybenzophenone, 4-n-dodecyloxy-2-hydroxybenzophenone, 2-hydroxy-4-methoxybenzophenone-5-sulfonic acid trihydrate, 2,2',4,4'-tetrahydroxybenzophenone, and 2,2'-dihydroxy-4,4'-dimethoxybenzophenone;

diphenylacrylate-based compounds such as ethyl 2-cyano-3,3-diphenyl acrylate;

cyanoacrylate-based compound;

diphenyl cyanoacrylate-based compounds such as (2'-ethylhexyl) 2-cyano-3,3-diphenyl acrylate;

benzothiazole-based compound:

azobenzene-based compound such as 4-[ethyl (2-hydroxyethyl)amino]-4'-nitroazobenzene, polyphenol-based compounds such as pyrogallol, phloroglycine, catechin, epicatechin, gallocatechin, catechin gallate, gallocatechin gallate, epicatechin gallate, epigallocatechin gallate, epigallocatechin, rutin, quercetin, quercetagin, quercetagetin, gossypetin, pelargonidin, cyanidin, aurantinidin, luteolinidin, peonidin, rosinidin, (1E, 6E)-1,7-bis(4-hydroxy-3-methoxyphenyl)-1,6-heptadiene-3,5-dione, and 1,7-bis(4-hydroxyphenyl)-1, 6-heptadiene-3,5-dione;

nickel complex salt-based compounds such as [2,2'-thiobis(4-tert-octylphenolate)]-2-ethylhexylamine nickel (II).

It is particularly preferred to use benzotriazole-based compounds, benzophenone-based compounds, azobenzene-based compounds, and polyphenol-based compounds.

As the component (D), 2-(2H-benzotriazol-2-yl)-4-(1,1, 3,3-tetramethylbutyl)phenol, 2-(2H-benzotriazol-2-yl)-4,6-bis(1-methyl-1-phenylethyl)phenol, 2-(2H-benzotriazol-2-yl)-p-cresol, 2,2',4,4'-tetrahydroxybenzophenone, 2,2'-dihydroxy-4,4'-dimethoxybenzophenone, 4-[ethyl(2-hydroxyethyl)amino]-4'-nitroazobenzene, (1E,6E)-1,7-bis (4-hydroxy-3-methoxyphenyl)-1,6-heptadiene-3,5-dione, and 1,7-bis(4-hydroxyphenyl)-1,6-heptadiene-3,5-dione are preferably used from the viewpoint of resolution (resolving property).

The component (D) may be used alone or in combination of two or more.

The content of the component (D) is preferably 0.05 parts by mass or more, more preferably 0.1 parts by mass or more, and still more preferably 0.2 parts by mass or more, based on 100 parts by mass of the component (A) in terms of excellent resolution (resolving property).

The content of the component (D) is preferably 5 parts by mass or less, more preferably 3 parts by mass or less, and still more preferably 2 parts by mass or less, based on 100 parts by mass of the component (A). By using the component (D) within the above-mentioned content, inadequate light-curing of the interior of the composition due to increased absorption at the surface thereof during active light irradiation can be suppressed.

The photosensitive resin composition of the invention may further contain (E) a polymerization inhibitor (hereinafter also referred to as "component (E)") from the viewpoint of ensuring storage stability.

Examples of the component (E) include a radical polymerization inhibitor, a radical polymerization retarder, and the like.

Examples of the component (E) include, for example, dixoids such as p-methoxyphenol, diphenyl-p-benzoquinone, benzoquinone, hydroquinone, pyrogallol, phenothiazine, resorcinol, ortho-dinitrobenzene, para-dinitrobenzene, meta-dinitrobenzene, phenanthraquinone, N-phenyl-2-naphthylamine, kuperone, 2,5-toluquinone, tannic acid, parabenzylaminophenol, nitrosoamines, and 1,4,4-trimethyl-2,3-diazabicyclo[3.2.2]-nona-2-ene-2,3-dixoid.

The component (E) may be used alone or in combination of 2 or more.

When the component (E) is comprised, the content of the component (E) is preferably 0.01 to 30 parts by mass, more preferably 0.01 to 10 parts by mass, and still more preferably 0.05 to 5 parts by mass, based on 100 parts by mass of the component (A) from the viewpoint of storage stability of the photosensitive resin composition and heat resistance of the cured product obtained.

The photosensitive resin composition of the invention may further contain (F) a rust inhibitor (hereinafter also referred to as "component (F)") from the viewpoint of suppressing corrosions and preventing discoloration of copper and copper alloys.

Examples of the component (F) include, for example, triazole derivatives such as 1,2,4-triazole, 1,2,3-triazole, 1,2,5-triazole, 3-mercapto-4-methyl-4H-1,2,4-triazole, 3-mercapto-1,2,4-triazole, 4-amino-3,5-dimethyl-4H-1,2,4-triazole, 4-amino-3,5-dipropyl-4H-1,2,4-triazole, 3-amino-5-isopropyl-1,2,4-triazole, 4-amino-3-mercapto-5-methyl-4H-1,2,4-triazole, 3-amino-5-mercapto-1,2,4-triazole, 3-amino-5-methyl-4H-1,2,4-triazole, 4-amino-1,2,4-triazole, 4-amino-3,5-dimethyl-1,2,4-triazole, 4-amino-5-methyl-4H-1,2,4-triazole-3-thiol, 3,5-diamino-1H-1,2,4-triazole, 5-methyl-1H-benzotriazole, 5,6-dimethylbenzotriazole, 5-amino-1H-benzotriazole, and benzotriazole-4-sulfonic acid, 1,2,3-benzotriazole; and tetrazole derivatives such as 1H-tetrazole, 5-methyl-1H-tetrazole, 5-(methylthio)-1H-tetrazole, 5-(ethylthio)-1H-tetrazole, 5-phenyl-1H-tetrazole, 5-nitro-1H-tetrazole, 1-methyl-1H-tetrazole, 5,5-bis-1H-tetrazole, and 5-amino-1H-tetrazole.

The component (F) may be used alone or in combination of two or more.

When the component (F) is used, the content of the rust inhibitor is preferably 0.01 to 10 parts by mass, more preferably 0.1 to 5 parts by mass, and more preferably 0.5 to 4 parts by mass based on 100 parts by mass of the component (A).

From the viewpoint of increasing adhesiveness of the obtained cured film to a substrate, the photosensitive resin composition of the invention may further contain (G) a silane coupling agent (adhesive aid) (hereinafter, also referred to as "component (G)").

Usually, the component (G) reacts and crosslinks with the component (A) during the heat treatment after development, or the component (G) itself polymerizes during the heat treatment step. As a result, it is possible to further increase the adhesiveness between the obtained cured product and the substrate.

Examples of the component (G) include compounds having an urea bond (—NH—CO—NH—). By using the component (G), even when curing is performed at a low temperature of 200° C. or lower, the adhesiveness to the substrate can be further enhanced.

The compound represented by the following formula (13) is more preferable from the viewpoint of excellent adhesiveness being exhibited when curing is performed at a low temperature.

(13)

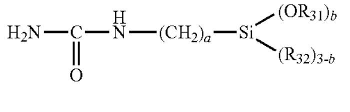

In the formula (13), $R_{31}$ and $R_{32}$ are independently an alkyl group including 1 to 5 carbon atoms; a is an integer of 1 to 10, and b is an integer of 1 to 3.

Specific examples of the compound represented by the formula (13) include ureidomethyltrimethoxysilane, ureidomethyltriethoxysilane, 2-ureidoethytrimethoxysilane, 2-ureidoethyltriethoxysilane, 3-ureidopropyltrimethoxysilane, 3-ureidopropyltriethoxysilane, 4-ureidobutyltrimethoxysilane, 4-ureidobutyltriethoxysilane, and the like. 3-ureidopropyftriethoxysilane is preferable.

As the component (G), a silane coupling agent having a hydroxy group or a glycidyl group may be used. When a silane coupling agent having a hydroxy group or a glycidyl group and a silane coupling agent having a urea bond in the molecular are used in combination, the adhesiveness of the cured product to a substrate when cured at a low temperature can be further increased.

Examples of the silane coupling agent having a hydroxy group or a glycidyl group include methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl n-propylphenylsilanol, ethylisopropylphenylsilanol, n-butylethyl phenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, 1,4-bis(dibutylhydroxysilyl)benzene, and a compound represented by the following formula (14). Among them, the compound represented by the formula (14) is particularly preferable in order to further increase the adhesiveness to the substrate, (14)

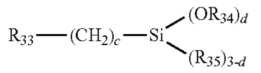

In the formula (14), $R_{33}$ is a monovalent organic group having a hydroxyl group or a glycidyl group; $R_{34}$ and $R_{35}$ are independently an alkyl group having 1 to 5 carbon atoms; c is an integer of 1 to 10, and d is an integer of 1 to 3.

Examples of the compound represented by the formula (14) include hydroxymethyltrimethoxysilane, hydroxymethyltriethoxysilane, 2-hydroxyethyltrimethoxysilane, 2-hydroxyethyltriethoxysilane, 3-hydroxypropyltrimethoxysilane, 3-hydroxypropyltriethoxysilane, 4-hydroxybutyltrimethoxysilane, 4 hydroxybutyltriethoxysilane, glycidoxymethyltrimethoxysilane, glycidoxymethyltriethoxysilane, 2-glycidoxyethyltrimethoxysilane, 2-glycidoxyethyltriethoxysilane, 3-glycidoxypropyltrimethoxysilane, 3-glycidoxypropyltriethoxysilane, 4-glycidoxybutyltrimethoxysilane, and 4-glycidoxybutyltriethoxysilane.

As a commercially available products, trade name "KBM403" (manufactured by Shin-Etsu Chemical Co., Ltd.) and the like may be mentioned.

The silane coupling agent having a hydroxy group or a glycidyl group further preferably contains a group having a nitrogen atom, and is preferably a silane coupling agent further having an amino group or an amide bond.

Examples of the silane coupling agents further having an amino group include bis(2-hydroxymethyl)-3-aminopropyltriethoxysilane, bis(2-hydroxymethyl)-3-aminopropyltrimethoxysilane, bis(2-glycidoxymethyl)-3-aminopropyltriethoxysilane, and bis(2-hydroxymethyl)-3-aminopropyltrimethoxysilane.

Examples of the silane coupling agents further having an amide bond include a compound represented by the following formula.

$$R_{36}—(CH_2)_e—CO—NH—(CH_2)_f—Si(OR_{37})_3$$

$R_{36}$ is a hydroxy group or glycidyl group; e and f are independently an integer of 1 to 3; and $R_{37}$ is a methyl group, an ethyl group, or a propyl group.

In addition, triethoxysilylpropylethyl carbonate may be used as the component (G).

The component (G) may be used alone or in combination of two or more.

When the component (G) is used, the content of the component (G) is preferably 0.1 to 20 parts by mass, more preferably 1 to 15 parts by mass, and still more preferably 1 to 10 parts by mass, based on 100 parts by mass of the component (A).

From the viewpoint of achieving both maintain of the residual film ratio and good resolution in a wide range of exposure amounts, the photosensitive resin composition of the invention may further contain (H) a sensitizer (hereinafter, also referred to as "component (H)").

Examples of the compound (H) include Michler's ketone, benzoin, 2-methylbenzoin, benzoin methyl ether, benzoin ethyl ether, benzoin isopropyl ether, benzoin butyl ether, 2-t-butylanthraquinone, 1,2-benzo-9,10-anthraquinone, anthraquinone, methylanthraquinone, 4,4'-bis(diethylamino)benzophenone, acetophenone, benzophenone, thioxanthone, 1,5-acenaphthene, 2,2-dimethoxy-2-phenylacetophenone, 1-hydroxycyclohexylphenyl ketone, 2-methyl-[4-(methylthio)phenyl]-2-morpholino-1-propanone, diacetylbenzyl, benzyl dimethyl ketal, benzyl diethyl ketal, diphenyl disulfide, anthracene, phenanthrenequinone, riboflavin tetrabutyrate, Acridine orange, erythrosine, phenanthrenequinone, 2-isopropylthioxanthone, 2,6-bis(p-diethylaminobenzylidene)-4-methyl-4-azacyclohexanone, 6-bis(p-dimethylaminobenzylidene)-cyclopentanone, 2,6-bis(p-diethylaminobenzylidene)-4-phenylcyclohexanone, amino styryl ketone, a 3-ketocoumarin compound, a biscoumarin compound, N-phenylglycine, N-phenyldiethanolamine, and 3,3',4,4'-tetra(t-butylperoxycarbonyl)benzophenone.

The component (H) may be used alone or in combination of two or more.

When the component (H) is contained, the blending amount of the component (H) is preferably 0.1 to 2.0 parts by mass, and more preferably 0.2 to 1.5 parts by mass, based on 100 parts by mass of the component (A).

From the viewpoint of promoting the polymerization reaction, the photosensitive resin composition of the invention may further contain (I) a thermal polymerization initiator (hereinafter also referred to as the "component (I)").

As the component (I), a compound which does not decompose by heating (drying) for removing a solvent at the time of film formation but decomposes by heating at the time of curing to generate radicals and accelerates polymerization reaction of components (B) with each other or between the component (A) and the component (B) is preferable.

The component (I) is preferably a compound having a decomposition point of 110° C. or more and 200° C. or lower, and from the viewpoint of promoting the polymerization reaction at a lower temperature, a compound having a decomposition point of 110° C. or more and 175° C. or lower is more preferable.

Specific examples include ketone peroxides such as methyl ethyl ketone peroxide; peroxyketals such as 1,1-di (t-hexylperoxy)-3,3,5-trimethylcyclohexane, 1,1-di(t-hexylperoxy)cyclohexane, and 1,1-di(t-butylperoxy)cyclohexane; hydroperoxides such as 1,1,3,3-tetramethylbutyl hydroperoxide, cumene hydroperoxide, and p-menthane hydroperoxide; dialkyl peroxides such as dicumyl peroxide and di-t-butyl peroxide; diacylperoxides such as dilauroyl peroxide and dibenzoyl peroxide; peroxydicarbonates such as di(4-t-butylcyclohexyDperoxydicarbonate and di(2-ethylhexyl)peroxydicarbonate; peroxyesters such as t-butylperoxy-2-ethylhexanoate, t-hexylperoxyisopropyl monocarbonate, t-butyl peroxybenzoate, and 1,1,3,3-tetramethylbutylperoxy-2-ethylhexanoate; and bis(1-phenyl-1-methylethyl)peroxide. As a commercially available product, trade names "PERCUMYL D," "PERCUMYL P," "PERCUMYL H," "PERBUTYL O" (manufactured by NOF CORPORATION) and the like can be mentioned.

The component (I) may be used alone or in combination of two or more.

When the component (I) is comprised, the content of the component (I) is preferably from 0.1 to 20 parts by mass with respect to 100 parts by mass of the component (A), more preferably from 0.2 to 20 parts by mass in order to ensure good flux resistance, and more preferably from 0.3 to 10 parts by mass from the viewpoint of suppressing a decrease in solubility due to decomposition at the time of drying.

The photosensitive resin composition of the invention may further contain (J) a solvent (hereinafter also referred to as "component (J)").

Examples of the component (J) include N-methyl-2-pyrrolidone, γ-butyrolactone, ethyl lactate, propylene glycol monomethyl ether acetate, benzyl acetate, n-butyl acetate, ethoxyethyl propionate, 3-methylmethoxypropionate, N,N-dimethylformamide, N,N-dimethylacetamide, dimethylsulfoxide, hexamethylphosphorylamide, tetramethylenesulfone, cyclohexanone, cyclopentanone, diethylketone, diisobutyl ketone, methylamyl ketone, N-dimethylmorpholine, and the like, and are generally not particularly limited as long as other components can be sufficiently dissolved.

Among them, N-methyl-2-pyrrolidone, γ-butyrolactone, ethyl lactate, propylene glycol monomethyl ether acetate, N,N-dimethylformamide, and N,N-dimethylacetamide are preferably used from the viewpoint of excellent solubility of each component and applicability at the time of forming a photosensitive resin film.

As the component (J), a compound represented by the following formula (21) may be used.

(21)

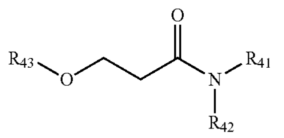

In the formula, $R_{41}$ to R; are independently an alkyl group including 1 to 10 carbon atoms.

Examples of the alkyl group including 1 to 10 (preferably 1 to 3, and more preferably 1 or 3) carbon atoms for $R_{41}$ to $R_{43}$ in the formula (21) include a methyl group, an ethyl group, an n-propyl group, an isopropyl group, an n-butyl group, a t-butyl group, a pentyl group, a hexyl group, a heptyl group, an octyl group, and the like.

The compound represented by the formula (21) is preferably 3-methoxy-N,N-dimethylpropanamide (e.g., trade name "KJCMPA-100", manufactured by KJ Chemicals Corporation).

The component (J) may be used alone or in combination of two or more.

The content of the component (J) is not particularly limited, but is generally 50 to 1000 parts by mass with respect to 100 parts by mass of the component (A).

The photosensitive resin composition of the invention may further contain a surfactant, a leveling agent, and the like.

By containing a surfactant or a leveling agent, applicability (for example, suppression of striation (unevenness in film thickness)) and developability can be increased.

Examples of the surfactant or the leveling agent include polyoxyethylene lauryl ether, polyoxyethylene stearyl ether, polyoxyethylene oleyl ether, polyoxyethylene octyl phenol ether, and the like, and as examples of commercially available products, trade names "Megaface F171", "F173", "R-08" (these are manufactured by DIC Corporation), trade names "Fluorad FC430", "FC431" (these are manufactured by Sumitomo 3M Limited), trade names "organosiloxane polymer KP341" (manufactured by Shin-Etsu Chemical Industry Co., Ltd.), and the like can be mentioned.

The surfactant and the leveling agent may be used alone or in combination of two or more.

When the surfactant or the leveling agent is contained, the content of the surfactant or the leveling agent is preferably 0.01 to 10 parts by mass, more preferably 0.05 to 5 parts by mass, and still more preferably 0.05 to 3 parts by mass with respect to 100 parts by mass of the component (A).

The photosensitive resin composition of the invention consists essentially of components (A) to (D), and optionally components (E) to (I), a surfactant, and leveling agent, except for the component (J), and may contain other unavoidable impurities within a range not impairing the effect of the invention.

For example, 80% by mass or more, 90% by mass or more, 95% by mass or more, 98% by mass or more or 100% by mass of the photosensitive resin composition of the invention, except for the component (J), may be composed of components (A) to (D),
components (A) to (I), or
components (A) to (D), and optionally components (E) to (I), a surfactant, and a leveling agent.

A cured product of the invention can be obtained by curing the above-described photosensitive resin composition.

The cured product of the invention may be used as a patterned cured product or a not-patterned cured product.

The thickness of the cured product of the invention is preferably 5 to 20 μm.

The cured product of the invention preferably has a pattern having an aspect ratio of 1 or more, more preferably has a pattern having an aspect ratio of 1.2 or more, and particularly preferably has a pattern having an aspect ratio of 1.5 or more.

The aspect ratio can be calculated according to the following expression, for example, by taking a cross-section of patterned cured product by scanning electrons microscopy (SEM) and measuring the film thickness and the opening width from the images.

Aspect ratio=(post-curing film thickness/opening width on substrate)

The method for producing a patterned cured product of the invention includes a step of applying the above-mentioned photosensitive resin composition on a substrate, followed by drying to form a photosensitive resin film, a step of pattern-exposing the photosensitive resin film to obtain a resin film, a step of developing the resin film having undergone the pattern-exposure using an organic solvent to obtain a patterned resin film, and a step of heat-treating the patterned resin film.

By the above-mentioned method, a patterned cured product can be obtained.

A method for producing a not-patterned cured product includes, for example, the above-described steps of forming a photosensitive resin film and of heat treating the photosensitive resin film. Further, the method may include a step of exposing.

Examples of the substrate include a glass substrate; a semiconductor substrate such as a Si substrate (a silicon wafer); a metal-oxide-insulator substrate such as a $TiO_2$ substrate and a $SiO_2$ substrate; a silicon nitride substrate; a copper substrate; and a copper alloy substrate.

The application method is not particularly limited, but can be performed using a spinner or the like.

The drying can be performed using a hot plate, an oven, or the like.

The drying temperature is preferably 90 to 150° C., and more preferably 90 to 120° C. from the viewpoint of ensuring dissolution contrast.

The drying time is preferably 30 seconds to 5 minutes.

The drying may be performed two or more times.

By the above-mentioned method, a photosensitive resin film in which the photosensitive resin composition described above is formed in a film shape can be obtained.

The thickness of the photosensitive resin film is preferably 5 to 100 μm, more preferably 6 to 50 μm, and still more preferably 7 to 30 μm.

In the pattern exposure, for example, light is exposed through a photomask having a predetermined pattern.

Examples of the active lights to be irradiated include ultraviolet rays such as i-ray, visible ray, radiant ray, and the like, and i-ray is preferable.

As the exposure apparatus, a parallel exposure machine, a projection exposure machine, a stepper, a scanner exposure machine, or the like can be used.

After exposure and before development, post-exposure bake (PEB) may be performed as necessary. The temperature of the post-exposure bake is preferably 60 to 160° C., and a time of the post-exposure bake is preferably 0.5 to 5 minutes.

As a result of development, a patterned resin film can be obtained. Generally, when a negative photosensitive resin composition is used, unexposed portions are removed with a developer.

As an organic solvent used as the developer, a good solvent for the photosensitive resin film can be used alone, or a good solvent and a poor solvent for the photosensitive resin film can be used in combination appropriately.

Examples of the good solvent include N-methyl-2-pyrrolidone, N-acetyl-2-pyrrolidone, N,N-dimethylacetamide, N,N-dimethylformamide, dimethylsulfoxide, γ-butyrolactone, α-acetyl-γ-butyrolactone, cyclopentanone, cyclohexanone, and the like.

Examples of the poor solvent include toluene, xylene, methanol, ethanol, isopropanol, propylene glycol monomethyl ether acetate, propylene glycol monomethyl ether, water, and the like.

A surfactant may be added to the developer. The surfactant is preferably added in an amount of 0.01 to 10 parts by mass and more preferably 0.1 to 5 parts by mass with respect to 100 parts by mass of the developer.

The development time can be, for example, twice as long as the time until the photosensitive resin film is completely dissolved in the developing liquid from when immersed therein.

The development time varies depending on the type of the component (A) used, but is preferably from 10 seconds to 15 minutes, more preferably from 10 seconds to 5 minutes, and more preferably from 20 seconds to 5 minutes from the viewpoint of productivity.

After development, washing may be performed with a rinse solution.

As the rinse solution, distilled water, methanol, ethanol, isopropanol, toluene, xylene, propylene glycol monomethyl ether acetate, propylene glycol monomethyl ether, or the like may be used alone or as a mixed as appropriate, or may be used in combination in change step by step.

A patterned cured product can be obtained by heat-treating the patterned resin film.

The polyimide precursor of the component (A) undergoes a dehydration ring closure reaction by the heat treatment step, usually resulting in the corresponding polyimide.

The temperature of the heat treatment is preferably 250° C. or lower, more preferably 120 to 250° C., and still more preferably 200° C. or lower or 160 to 200° C.

Within the above range, damage to the substrate and the device can be suppressed to a small level, the device can be produced with a high yield, and energy saving of the process can be realized.

The time of the heat treatment is preferably 5 hours or less, and more preferably 30 minutes to 3 hours.

Within the above range, the crosslinking reaction or the dehydration ring closure reaction can sufficiently proceed.

The atmosphere of the heat treatment may be an air atmosphere or an inert atmosphere such as nitrogen, but from the viewpoint of preventing the patterned resin film from oxidation, the atmosphere is preferably a nitrogen atmosphere.

Examples of the device used for the heat treatment include a quartz tube oven, a hot plate, a rapid thermal annealing, a vertical diffusion furnace oven, an infrared curing oven, an electron beam curing oven, and a microwave curing oven.

The cured product of the invention can be used as a passivation film, a buffer coat film, an interlayer insulating film, a cover coat layer, a surface protective film, or the like.

With the use of one or more selected from the group consisting of the passivation film, the buffer coat film, the interlayer insulating film, the cover coat layer, the surface protective film, and the like, highly reliable electronic components such as semiconductor devices, multilayer wiring boards, various electronic devices, and laminated devices (such as multi-die fan-out wafer level packages) can be manufactured.

An example of a manufacturing process of a semiconductor apparatus which is an electronic component of the invention will be described with reference to the drawings.

FIG. 1 is a manufacturing process diagram of a semiconductor apparatus having a multilayer wiring structure which is an electronic component according to an embodiment of the invention.

In FIG. 1, a semiconductor substrate 1 such as a Si substrate having a circuit device is covered with a protective film 2 such as a silicon oxide film except a predetermined portion of the circuit device, and a first conductive layer 3 is formed on the exposed circuit device. Thereafter, an interlayer insulating film 4 is formed on the semiconductor substrate 1.

Next, a photosensitive resin layer 5 such as a chlorinated rubber-based resin, a phenolic novolac-based resin, or the like is formed on the interlayer insulating film 4, and a window 6A is provided so that a predetermined portion of the interlayer insulating film 4 is exposed by a known photolithography technique.

The interlayer insulating film 4 in which the window 6A is opened is selectively etched to provide a window 6B.

Next, the photosensitive resin layer 5 is completely removed by using an etchant that etches only the photosensitive resin layer 5 without corroding the first conductive layer 3 exposed from the window 6B.

Further, the second conductive layer 7 is formed by using a known photolithography technique and electrically connected to the first conductive layer 3.

In the case of forming a multilayer wiring structure of three or more layers, each layer can be formed by repeating the above steps.

Next, by using the above-mentioned photosensitive resin composition, the window 6C is opened by pattern-exposure to form a surface protective film 8. The surface protective film 8 protects the second conductive layer 7 from external stress, a rays, and the like, and the resulting semiconductor device is excellent in reliability.

In the above example, it is also possible to form an interlayer insulating film using the photosensitive resin composition of the invention.

EXAMPLES

Hereinafter, the invention will be described more specifically on the basis of Examples and Comparative Examples. The invention is not limited to the following Examples.

Each of the components used in the Examples and Comparative Examples is as follows.

Component (A): A Polyimide Precursor Having a Polymerizable Unsaturated Bond

A1: the compound obtained in Synthesis Example 1 described later

A2: the compound obtained in Synthesis Example 2 described later

A3: the compound obtained in Synthesis Example 3 described later

A4: the compound obtained in Synthesis Example 4 described later

Component (B): A Polymerizable Monomer

B1: A-DCP (manufactured by Shin-Nakamura Chemical Co., Ltd., tricyclodecanedimethanol diacrylate, the compound represented by the following formula)

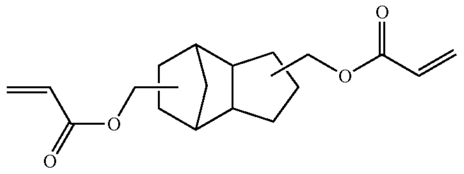

B2: ATM-4E (manufactured by Shin-Nakamura Chemical Co., Ltd., tetrakisacrylic acid (methanetetrayl)tetrakis(methyleneoxyethylene) ester)

B3: TEGDMA (manufactured by Shin-Nakamura Chemical Co., Ltd., tetraethylene glycol dimethacrylate)

B4: A-TMMT (manufactured by Shin-Nakamura Chemical Co., Ltd., pentaerythritol tetraacrylate)

Component (C): A Photopolymerization Initiator

C1: IRGACURE OXE 02 (manufactured by BASF Japan, Inc., Ethanone, 1-[9-ethyl-6-(2-methylbenzoyl)-9H-carbazol-3-yl]-, 1-(O-acetyloxime))

C2: G-1820 (PDO) (manufactured by Lambson Ltd., 1-phenyl-1,2-propanedione-2-(O-ethoxycarbonyl)oxime)

C3: NCI-930 (ADEKA CORPORATION, 2-(acetoxyimino)-1-[4-[4-(2-hydroxyethoxy)phenylsulfanil]phenyl]propan-1-one)

Component (D): An Ultraviolet Absorber

D1: Adecastab LA-29 (manufactured by ADEKA CORPORATION, 2-(2H-benzotriazol-2-yl)-4-(1,1,3,3-tetramethylbutyl)phenol)

D2: Adecastab LA-24 (manufactured by ADEKA CORPORATION, 2-(2H-benzotriazol-2-yl)-4,6-bis(1-methyl-1-phenylethyl)phenol)

D3: Adecastab LA-32 (manufactured by ADEKA CORPORATION, 2-(2H-benzotriazol-2-yl)-p-cresol)

D4: SEESORB106 (manufactured by SHIPRO KASEI KAISHA, LTD., 2,2',4,4'-tetrahydroxy benzophenone)

D5: SEESORB107 (manufactured by SHIPRO KASEI KAISHA, LTD., 2,2'-dihydroxy-4,4'-dimethoxybenzophenone)

D6: Disperse Red 1 (manufactured by Hitachi Chemical Techno Service Co., Ltd., 4-[ethyl(2-hydroxyethyl)amino]-4'-nitroazobenzene)

D7: Curcumin (manufactured by SANWA CHEMICAL CO., LTD., (1E,6E)-1,7-bis(4-hydroxy-3-methoxyphenyl)-1,6-heptadiene-3,5-dione)

D8: HPH (manufactured by SANWA CHEMICAL CO., LTD., 1,7-bis(4-hydroxyphenyl)-1,6-heptadiene-3,5-dione)

Component (E): A Polymerization Inhibitor

E1: Taobn (manufactured by Hampford Research Inc., 1,4,4-trimethyl-2,3-diazabicyclo[3.2.2]-nona-2-ene-2,3-dixoid)

E2: hydroquinone

Component (H): A Sensitzer

H1: EMK (manufactured by Sigma-Aldrich Co. LLC, 4,4-bis(diethylamino) benzophenone)

Component (I): A Thermal Polymerization Initiator

I1: PERCUMYL D (manufactured by NOF CORPORATION, bis(1-phenyl-1-methylethyl) peroxide)

Component (J): A Solvent

J1: N-methyl-2-pyrrolidone

J2: γ-butyrolactone

J3: KJCMPA-100 (manufactured by KJ Chemicals Corporation, 3-methoxy-N,N-dimethylpropanamide)

[Absorbance Measurement]

The absorbance of D1 to D8 were measured under the following conditions. The results are shown in Table 1.

D1 to D8 were dissolved in chloroform, respectively, and adjusted to a concentration of 10 mg/L as a sample for measurement.

Measurement instrument: U-3900H (manufactured by Hitachi High-Tech Science Corporation)

Measurement conditions: cell length: 10.0 mm

TABLE 1

| | Absorbance |
|---|---|
| D1 | 0.23 |
| D2 | 0.25 |
| D3 | 0.38 |
| D4 | 0.4 |
| D5 | 0.64 |
| D6 | 0.21 |
| D7 | 0.25 |
| D8 | 0.26 |

Synthesis Example 1 (Synthesis of A1)

47.1 g (152 mmol) of 3,3',4,4-diphenylethertetracarboxylic dianhydride (ODPA), 5.54 g (43 mmol) of 2-hydroxyethyl methacrylate (HEMA), and a catalytic amount of 1,4-diazabicyclo[2.2.2]octane triethylenediamine were dissolved in 380 g of N-methyl-2-pyrrolidone (NMP), stirred at 45° C. for 1 hour, then cooled to 25° C., 27.4 g (129 mmol) of 2,2'-dimethylbenzidine and 145 mL of dried N-methyl-2-pyrrolidone were added, then stirred at 45° C. for 150 minutes, and cooled to room temperature. To this solution, 59.7 g (284 mmol) of trifluoroacetic anhydride was added dropwise, followed by stirring for 120 minutes, then a catalytic amount of benzoquinone was added, and 40.4 g (310 mmol) of HEMA was further added, and the solution was stirred at 45° C. for 20 hours. The reaction solution was added dropwise to distilled water, and precipitates were collected by filtration and dried under reduced pressure to obtain a polyimide precursor A1.

The weight-average molecular weight was determined by standard polystyrene conversion using the gel permeation chromatography (GPC) method under the following conditions. The weight-average molecular weight of A1 was 35,000.

Measurement was carried out using a solution of 0.5 mg of A1 in 1 mL of solvent [tetrahydrofuran (THF)/dimethylformamide (DMF)=1/1 (volume ratio)].

Measuring instrument: Detector L4000UV manufactured by Hitachi, Ltd.

Pumps: L6000 manufactured by Hitachi, Ltd.

C-R4A Chromatopac manufactured by Shimadzu Corporation

Measuring conditions: two columns of Gelpack GL-S300MDT-5

Eluent: THF/DMF=1/1 (volume ratio)

LiBr (0.03 mol/L), $H_3PO_4$ (0.06 mol/L)

Flow rate: 1.0 mL/min, detector: UV 270 nm

The esterification ratio of A1 (the ratio of reaction with the HEMA of the carboxylic group of ODPA) was calculated from the result of NMR-measurement under the following condition. The esterification rate was 81 mol % relative to all the carboxy groups of the polyamic acid (the total of the carboxy groups and the carboxy esters). The remaining 19 mol % remained as carboxy groups.

Measurement instrument: AV400M manufactured by Bruker Japan K.K.

Magnetic field strength: 400 MHz

Reference substance: tetramethylsilane (TMS)

Solvent: dimethyl sulfoxide (DMSO)

Synthesis Example 2 (Synthesis of A2)

47.1 g (152 mmol) of ODPA, 2.77 g (21 mmol) of HEMA, and a catalytic amount of 1,4-diazabicyclo[2.2.2]octane triethylenediamine were dissolved in 500 g of NMP. The reaction solution was stirred at 45° C. for 1 hour, then cooled to 25° C., 30.0 g (141 mmol) of 2,2'-dimethylbenzidine and 145 mL of dried NMP were added, stirred at 45° C. for 150 minutes, and then cooled to room temperature. To this solution, 65.2 g (311 mmol) of trifluoroacteic anhydride vas added dropwise, followed by stirring for 180 minutes. Then, to the reaction solution, a catalytic amount of benzoquinone was added, and 43.1 g (331 mmol) of HEMA was further added, and the solution was stirred at 45° C. for 20 hours. The reaction solution was added dropwise to distilled water, and precipitates were collected by filtration and dried under reduced pressure to obtain polyimide precursor A2.

The weight-average molecular weight was determined by standard polystyrene conversion using the gel permeation chromatography (GPC) method under the same conditions as in Synthesis Example 1. The weight-average molecular weight of A2 was 70,000.

Further, the esterification ratio of A2 was calculated from the result of NMR measurement under the same conditions as in Synthesis Example 1. The esterification ratio was 73 mol % relative to all the carboxy groups of the polyamic acid (the total carboxy group and the total carboxy ester). The remaining 27 mol % remained as carboxy groups.

Synthesis Example 3 (Synthesis of A3)

62.0 g (200 mmol) of ODPA, 5.2 g (40.0 mmol) of HEMA, and a catalytic amount of 1,4-diazabicyclo[2.2.2] octane triethylenediamine were dissolved in 250 g of NMP. The reaction solution was stirred at 45° C. for 1 hour, then cooled to 25° C. To the reaction solution, 5.5 g (50.9 mmol) of m-phenylenediamine, 23.8 g (119 mmol) of oxydianiline (4,4-diaminodiphenyl ether), and 100 mL of dried NMP were added, stirred at 45° C. for 150 minutes, and then cooled to room temperature. To this solution, 78.5 g (374 mmol) of trifluoroacetic anhydride was added dropwise, and the mixture was stirred for 20 minutes, then 53.1 g (408 mmol) of HEMA was added, followed by stirring at 45° C. for 20 hours. The reaction solution was added dropwise to distilled water, and precipitates were collected by filtration and dried under reduced pressure to obtain polyimide precursor A3.

Using the GPC method, the weight-average molecular weight was determined under the same conditions as in Synthesis Example 1. The weight-average molecular weight of A3 was 35,000.

Further, the esterification ratio of A3 was calculated from the result of NMR measurement under the same conditions as in Synthesis Example 1. The esterification ratio was 70 mol % relative to all the carboxy groups of the polyamic acid (the total of carboxy groups and total carboxy esters). The remaining 30 mol % remained as carboxy groups.

Synthesis Example 4 (Synthesis of A4)

43.6 g (200 mmol) of pyromellitic dianhydride (PMDA), 54.9 g (401 mmol) of HEMA, and 0.220 g of hydroquinone were dissolved in 394 g of NMP, and a catalytic amount of 1,8-diazabicycloundecene was added. Then, esterification reaction was conducted by stirring at 25° C. for 24 hours to obtain a pyromellitic acid-hydroxyethyl methacrylate diester solution. This solution is referred to as a PMDA-HEMA solution.

49.6 g (160 mmol) of ODPA, 4.98 g (328 mmol) of HEMA, and 0.176 g of hydroquinone were dissolved in 378 g of NMP, and a catalytic amount of 1,8-diazabicycloundecene was added. then, esterification reaction was conducted by stirring at 25° C. for 48 hours to obtain a 3,3',4,4'-diphenylether tetracarboxylic acid-hydroxyethyl methacrylate diester solution. This solution is referred to as an ODPA-HEMA solution.

196 g of a PMDA-HEMA solution and 58.7 g of an ODPA-HEMA solution were mixed, and then 25.9 g (218 mmol) of thionyl chloride was added dropwise under ice cooling using a dropping funnel so as to keep the reaction solution temperature of 10° C. or lower. After the addition of thionyl chloride was completed, the reaction was carried out for 2 hours in ice cooling to obtain a solution of acid chloride of PMDA and ODPA. Then, using a dropping funnel, a solution of 31.7 g (99.0 mmol) of 2,2'-bis(trifluoromethyl) benzidine, 34.5 g (436 mmol) of pyridine, and 0.076 g (693 mmol) of hydroquinone in 90.2 g of NMP was added dropwise to the reaction solution under ice cooling with care so that the temperature of the reaction solution did not exceed 10° C. The reaction solution was added dropwise to distilled water, and precipitates were collected by filtration and dried under reduced pressure to obtain polyimide precursor A4.

Using the GPC method, the weight-average molecular weight was determined under the same conditions as in Synthesis Example 1. The weight-average molecular weight of A4 was 34,000.

Further, the esterification ratio of A4 was calculated from the result of NMR measurement under the same conditions as in Synthesis Example 1. The esterification ratio was 97 mol % relative to all the carboxy groups of the polyamic acid (the total carboxy group and the total carboxy ester). The remaining 3 mol % remained as carboxy groups.

Examples 1 to 24 and Comparative Examples 1 to 7

[Preparation of Photosensitive Resin Composition]

The photosensitive resin compositions of Examples 1 to 24 and Comparative Examples 1 to 7 were prepared with the components in the blending amounts shown in Tables 2 and 3. The blending amounts shown in Table 2 and Table 3 are indicated in parts by mass of each component based on 100 parts by mass of the component (A).

[Production of Patterned Resin Film]

The obtained photosensitive resin composition was spin-coated on a silicon wafer using a coating device Act8 (manufactured by Tokyo Electron Limited), dried at 100° C. for 2 minutes, and then dried at 110° C. for 2 minutes to form a photosensitive resin film having a dry film thickness of 7 to 10 μm.

The development time was set to twice the time required to completely dissolve the obtained photosensitive resin film by immersion in cyclopentanone.

In addition, a photosensitive resin film was produced in the same manner as described above, and the obtained photosensitive resin film was exposed by irradiating through a photomask for forming via holes with a radius of 1 μm to 100 μm at an exposure dose shown in Tables 2 and 3 using an i-ray stepper FPA-3000iW (manufactured by Canon Inc.).

Using Act8, post-exposure bake of the resin film was performed at 120° C. for 3 minutes under atmospheric conditions.

The resin film after the post-exposure bake was paddle-developed in cyclopentanone using Act8 for the above development time, and then rinsed with propylene glycol monomethyl ether acetate (PGMEA) to obtain a patterned resin film.

[Production of Patterned Cured Product]

The obtained patterned resin film was heated at 175° C. for 1 hour in a nitrogen atmosphere using a vertical diffusion furnace μ-TF (manufactured by Koyo Thermo Systems Co., Ltd.) to obtain a patterned cured product (film thickness after curing: 5 μm).

[Evaluation of Resolution]

The obtained patterned cured product was observed using an optical microscope, and the minimum diameter of the opening where 55% or more of the substrate surface, with respect to the area of mask size of the via hole was exposed was defined as the resolution, and evaluated according to the following criteria.

A: A pattern less than 4 μm was opened.

B: A pattern of 4 μm or more and less than 6 μm was opened.

C: A pattern of 6 μm or more and less than 8 μm was opened.

D: A pattern of 8 μm or more was opened.

The results are shown in Table 2 and Table 3.

[Evaluation of Aspect Ratio]

The resulting patterned cured product was cross-sectionally observed using a focused ion beam machining/scanning electrons microscopy complex (FIB-SEM) SM1500 (manufactured by Hitachi High-Tech Science Corporation).

From the obtained cross-sectional image, thickness of the post-curing film and width of the opening on the substrate were measured. The aspect ratio was calculated according to the following expression.

Aspect ratio=(post-curing film thickness/opening width on substrate)

The results are shown in Table 2 and Table 3.

TABLE 2

| | | | Example | | | | | | | | |
|---|---|---|---|---|---|---|---|---|---|---|---|
| | | | 1 | 2 | 3 | 4 | 5 | 6 | 7 | 8 | 9 |
| Photosensitive resin composition | Component (A) | A1 | 100 | 100 | 100 | 100 | 100 | 100 | 100 | 100 | 100 |
| | Component (B) | B1 | 25 | 25 | 25 | 25 | 25 | 25 | 25 | 25 | 25 |
| | | B2 | 10 | 10 | 10 | 10 | 10 | 10 | 10 | 10 | 10 |
| | Component (C) | C1 | 0.2 | 0.2 | 0.2 | 0.2 | — | — | 0.2 | 0.2 | 0.2 |
| | | C2 | 3 | 3 | 5 | 7 | — | — | 7 | 7 | 7 |
| | | C3 | — | — | — | — | 1 | 2 | — | — | — |
| | Component (D) | D1 | 1 | — | 1 | 1 | 1 | 1 | — | — | — |
| | | D2 | — | — | — | — | — | — | 1 | — | — |

TABLE 2-continued

| | | | | | | | | | | | |
|---|---|---|---|---|---|---|---|---|---|---|---|
| | | D3 | — | — | — | — | — | — | — | 1 | — |
| | | D4 | — | — | — | — | — | — | — | — | — |
| | | D5 | — | — | — | — | — | — | — | — | — |
| | | D6 | — | 0.5 | — | — | — | — | — | — | 0.5 |
| | | D7 | — | — | — | — | — | — | — | — | — |
| | | D8 | — | — | — | — | — | — | — | — | — |
| | Component (E) | E1 | 0.3 | 0.3 | 0.3 | 0.3 | 0.3 | 0.3 | 0.3 | 0.3 | 0.3 |
| | Component (H) | H1 | 0.4 | 0.4 | 0.4 | 0.4 | 0.4 | 0.4 | 0.4 | 0.4 | 0.4 |
| | Component (I) | I1 | 2 | 2 | 2 | 2 | 2 | 2 | 2 | 2 | 2 |
| | Component (J) | J3 | 200 | 200 | 200 | 200 | 200 | 200 | 200 | 200 | 200 |
| Exposure dose(mJ/cm$^2$) | | | 700 | 1100 | 700 | 500 | 200 | 200 | 300 | 300 | 400 |
| Evaluation | Resolution | | A | A | A | A | A | A | A | A | A |
| | Aspect ratio | | 1.53 | 1.54 | 1.69 | 1.60 | 1.79 | 2.26 | 1.51 | 1.48 | 1.54 |

| | | | Example | | | | | | | |
|---|---|---|---|---|---|---|---|---|---|---|
| | | | 10 | 11 | 12 | 13 | 14 | 15 | 16 | 17 |
| Photosensitive resin composition | Component (A) | A1 | 100 | 100 | 100 | 100 | 100 | 100 | 100 | 100 |
| | Component (B) | B1 | 25 | 25 | 25 | 25 | 25 | 25 | 25 | 25 |
| | | B2 | 10 | 10 | 10 | 10 | 10 | 10 | 10 | 10 |
| | Component (C) | C1 | 0.2 | 0.2 | 0.2 | 0.2 | 0.2 | 0.2 | 0.2 | 0.4 |
| | | C2 | 3 | 3 | 3 | 3 | 3 | 6 | 6 | 3 |
| | | C3 | — | — | — | — | — | — | — | — |
| | Component (D) | D1 | — | — | — | — | — | — | — | — |
| | | D2 | — | — | — | — | — | — | — | — |
| | | D3 | — | — | — | — | — | — | — | — |
| | | D4 | — | — | 0.5 | — | — | — | — | — |
| | | D5 | — | — | — | 0.5 | — | — | — | — |
| | | D6 | — | — | — | — | — | — | — | — |
| | | D7 | 0.5 | — | — | — | 1 | 0.5 | 1 | 0.5 |
| | | D8 | — | 0.5 | — | — | — | — | — | — |
| | Component (E) | E1 | 0.3 | 0.3 | 0.3 | 0.3 | 0.3 | 0.3 | 0.3 | 0.3 |
| | Component (H) | H1 | 0.4 | 0.4 | 0.4 | 0.4 | 0.4 | 0.4 | 0.4 | 0.4 |
| | Component (I) | I1 | 2 | 2 | 2 | 2 | 2 | 2 | 2 | 2 |
| | Component (J) | J3 | 200 | 200 | 200 | 200 | 200 | 200 | 200 | 200 |
| Exposure dose(mJ/cm$^2$) | | | 600 | 800 | 700 | 500 | 1000 | 500 | 500 | 400 |
| Evaluation | Resolution | | A | A | A | A | A | A | A | A |
| | Aspect ratio | | 1.83 | 1.51 | 1.53 | 1.51 | 1.44 | 1.41 | 1.41 | 1.52 |

TABLE 3

| | | | Example | | | | | | | Comp. Ex. |
|---|---|---|---|---|---|---|---|---|---|---|
| | | | 18 | 19 | 20 | 21 | 22 | 23 | 24 | 1 |
| Photosensitive resin composition | Component (A) | A1 | 100 | 100 | 100 | 100 | 100 | 100 | 100 | 100 |
| | Component (B) | B1 | 25 | 25 | 25 | 25 | 25 | 25 | — | 25 |
| | | B2 | 10 | 10 | 10 | 10 | 10 | 10 | 15 | 10 |
| | | B3 | — | — | — | — | — | — | 20 | — |
| | Component (C) | C1 | 0.4 | — | 0.4 | 0.5 | 0.5 | 0.5 | 0.2 | 0.2 |
| | | C2 | 3 | — | 6 | 3 | — | — | 2 | 3 |
| | | C3 | — | 2 | — | — | 0.5 | 0.5 | — | — |
| | Component (D) | D7 | 1 | 1 | 1 | 0.5 | 0.5 | 1 | 0.5 | — |
| | Component (E) | E1 | 0.3 | 0.3 | 0.3 | 0.3 | 0.3 | 0.3 | 0.3 | 0.3 |
| | | E2 | — | — | — | — | — | — | — | — |
| | Component (H) | H1 | 0.4 | 0.4 | 0.4 | 0.4 | — | — | 0.4 | 0.4 |
| | Component (I) | I1 | 2 | 2 | 2 | 2 | 2 | 2 | — | 2 |
| | Component (J) | J1 | — | — | — | — | — | — | — | — |
| | | J3 | 200 | 200 | 200 | 200 | 200 | 200 | 200 | 200 |
| Exposure dose(mJ/cm$^5$) | | | 500 | 200 | 400 | 300 | 100 | 200 | 400 | 500 |
| Evaluation | Resolution | | A | A | A | A | A | A | A | B |
| | Aspect ratio | | 1.66 | 3.22 | 1.61 | 1.59 | 2.17 | 1.55 | 1.60 | 1.18 |

| | | | Comp. Ex. | | | | | |
|---|---|---|---|---|---|---|---|---|
| | | | 2 | 3 | 4 | 5 | 6 | 7 |
| Photosensitive resin composition | Component (A) | A1 | 100 | 100 | 100 | 100 | 100 | 100 |
| | Component (B) | B1 | 25 | 25 | 25 | — | 25 | 25 |
| | | B2 | 10 | 10 | 10 | 15 | 10 | 10 |
| | | B3 | — | — | — | 20 | — | — |
| | Component (C) | C1 | 0.2 | 0.2 | — | 0.2 | 0.2 | 0.2 |
| | | C2 | 5 | 7 | — | 2 | 6 | 9 |
| | | C3 | — | — | 2 | — | — | — |

TABLE 3-continued

| | | | | | | | | |
|---|---|---|---|---|---|---|---|---|
| | Component (D) | D7 | — | — | — | — | — | — |
| | Component (E) | E1 | 0.3 | 0.3 | 0.3 | 0.3 | 0.3 | 0.3 |
| | | E2 | — | — | — | — | 1 | 1 |
| | Component (H) | H1 | 0.4 | 0.4 | — | 0.4 | 0.4 | 0.4 |
| | Component (I) | I1 | 2 | 2 | 2 | — | 2 | 2 |
| | Component (J) | J1 | — | — | — | — | — | — |
| | | J3 | 200 | 200 | 200 | 200 | 200 | 200 |
| Exposure dose(mJ/cm$^5$) | | | 400 | 400 | 200 | 200 | 1200 | 1200 |
| Evaluation | Resolution | | B | B | C | C | B | B |
| | Aspect ratio | | 1.18 | 1.26 | 0.90 | 0.81 | 0.73 | 0.90 |

Examples 5a, 6a, 10a and 20a to 23a, and Comparative Examples 1a to 4a, 7a and 8a

[Preparation of Photosensitive Resin Composition]

The photosensitive resin compositions of Examples 5a, 6a, 10a and 20a to 23a, and Comparative Examples 1a to 4a, 7a and 8a were prepared with the components in the blending amounts shown in Table 4. The blending amount of Table 4 is indicated in parts by mass of each component based on 100 parts by mass of the component (A).

[Production of Patterned Resin Film]

The obtained photosensitive resin composition was used to form a photosensitive resin film in the same manner as in Examples 1 to 24 and Comparative Examples 1 to 7.

The development time was set to twice the time required to completely dissolve the obtained photosensitive resin film by immersion in cyclopentanone.

In addition, a photosensitive resin film was produced in the same manner as described above, and the obtained photosensitive resin film was exposed by irradiating through a photomask for forming via holes with a radius of 1 μm to 100 μm at an exposure dose shown in Table 4 using FPA-3000iW.

The exposed resin film was paddle-developed in cyclopentanone using Act8 for the above development time, and then rinsed with PGMEA to obtain a patterned resin film.

[Production of Patterned Cured Product]

The obtained patterned resin film was heated at 175° C. for 1 hour in a nitrogen atmosphere using μ-TF to obtain a patterned cured product (film thickness after curing: 5 μm).

[Evaluation of Resolution]

The resolution of the obtained patterned cured product was evaluated in the same manner as in Examples 1 to 24 and Comparative Examples 1 to 7.

The results are shown in Table 4.

[Evaluation of Aspect Ratio]

The aspect ratio of the obtained patterned cured product was calculated in the same manner as in Examples 1 to 24 and Comparative Examples 1 to 7.

The results are shown in Table 4.

TABLE 4

| | | | Example | | | | | | |
|---|---|---|---|---|---|---|---|---|---|
| | | | 5a | 6a | 10a | 20a | 21a | 22a | 23a |
| Photosensitive resin composition | Component (A) | A1 | 100 | 100 | 100 | 100 | 100 | 100 | 100 |
| | Component (B) | B1 | 25 | 25 | 25 | 25 | 25 | 25 | 25 |
| | | B2 | 10 | 10 | 10 | 10 | 10 | 10 | 10 |
| | Component (C) | C1 | — | — | 0.2 | 0.4 | 0.5 | 0.5 | 0.5 |
| | | C2 | — | — | 3 | 6 | 3 | — | — |
| | | C3 | 1 | 2 | — | — | — | 0.5 | 0.5 |
| | Component (D) | D1 | 1 | 1 | — | — | — | — | — |
| | | D7 | — | — | 0.5 | 1 | 0.5 | 0.5 | 1 |
| | Component (E) | E1 | 0.3 | 0.3 | 0.3 | 0.3 | 0.3 | 0.3 | 0.3 |
| | | E2 | — | — | — | — | — | — | — |
| | Component (H) | H1 | 0.4 | 0.4 | 0.4 | 0.4 | 0.4 | — | — |
| | Component (I) | I1 | 2 | 2 | 2 | 2 | 2 | 2 | 2 |
| | Component (J) | J3 | 200 | 200 | 200 | 200 | 200 | 200 | 200 |
| Exposure dose(mJ/cm$^2$) | | | 200 | 200 | 1000 | 500 | 400 | 200 | 300 |
| Evaluation | Resolution | | A | A | A | A | A | A | A |
| | Aspect ratio | | 1.73 | 2.05 | 1.34 | 1.24 | 1.23 | 1.60 | 1.56 |

| | | | Comp. Ex. | | | | | |
|---|---|---|---|---|---|---|---|---|
| | | | 1a | 2a | 3a | 4a | 7a | 8a |
| Photosensitive resin composition | Component (A) | A1 | 100 | 100 | 100 | 100 | 100 | 100 |
| | Component (B) | B1 | 25 | 25 | 25 | 25 | 25 | 25 |
| | | B2 | 10 | 10 | 10 | 10 | 10 | 10 |
| | Component (C) | C1 | 0.2 | 0.2 | 0.2 | — | 0.2 | 0.2 |
| | | C2 | 3 | 5 | 7 | — | 6 | 9 |
| | | C3 | — | — | — | 2 | — | — |
| | Component (D) | D1 | — | — | — | — | — | — |
| | | D7 | — | — | — | — | — | — |
| | Component (E) | E1 | 0.3 | 0.3 | 0.3 | 0.3 | 0.3 | 0.3 |
| | | E2 | — | — | — | — | 1 | 1 |
| | Component (H) | H1 | 0.4 | 0.4 | 0.4 | — | 0.4 | 0.4 |
| | Component (I) | I1 | 2 | 2 | 2 | 2 | 2 | 2 |
| | Component (J) | J3 | 200 | 200 | 200 | 200 | 200 | 200 |

TABLE 4-continued

| | | | | | | | |
|---|---|---|---|---|---|---|---|
| Exposure dose(mJ/cm$^2$) | | 800 | 500 | 600 | 200 | 1200 | 1200 |
| Evaluation | Resolution | C | B | D | C | B | C |
| | Aspect ratio | 0.76 | 1.16 | 0.57 | 0.89 | 0.70 | 0.70 |

Examples 25 to 27, and Comparative Examples 8 to 10

[Preparation of Photosensitive Resin Composition]

The photosensitive resin compositions of Examples 25 to 27, and Comparative Examples 8 to 10 were prepared by using the components in the amounts shown in Table 5. The blending amount of Table 5 is indicated in parts by mass of each component based on 100 parts by mass of the component (A).

[Production of Patterned Resin Film]

The obtained photosensitive resin composition was spin-coated on a silicon wafer using Act8, dried at 100° C. for 2 minutes, and then dried at 110° C. for 2 minutes to form a photosensitive resin film having a dry film thickness of 12 to 15 μm.

The development time was set to twice the time required to completely dissolve the obtained photosensitive resin film by immersion in cyclopentanone.

In addition, a photosensitive resin film was produced in the same manner as described above, and the obtained photosensitive resin film was exposed by irradiating through a photomask for forming via holes with a radius of 1 μm to 100 μm at an exposure dose shown in Table 5 using FPA-3000iW.

The exposed resin film was paddle-developed in cyclopentanone using Act8 for the above development time, and then rinsed with PGMEA to obtain a patterned resin film.

[Production of Patterned Cured Product]

The obtained patterned resin film was heated at 175° C. for 1 hour in a nitrogen atmosphere using μ-TF to obtain a patterned cured product (film thickness after curing: 10 μm).

[Evaluation of Resolution]

The obtained patterned cured product was observed using an optical microscope, and the minimum diameter of the opening where 55% or more of the substrate surface, with respect to the area of mask size of the via hole was exposed was defined as the resolution, and evaluated according to the following criteria.

A: A pattern less than 8 μm was opened.

B: A pattern of 8 μm or more and less than 10 μm was opened.

C: A pattern of 10 μm or more and less than 15 μm was opened.

D: A pattern of 15 μm or more was opened.

The results are shown in Table 5.

[Evaluation of Aspect Ratio]

The aspect ratio of the obtained patterned cured product was calculated in the same manner as in Examples 1 to 24 and Comparative Examples 1 to 7.

The results are shown in Table 5.

TABLE 5

| | | | Example | | | Comp. Ex. | | |
|---|---|---|---|---|---|---|---|---|
| | | | 25 | 26 | 27 | 8 | 9 | 10 |
| Photosensitive resin composition | Component (A) | A1 | 100 | — | — | 100 | — | — |
| | | A2 | — | 100 | — | — | 100 | — |
| | | A4 | — | — | 100 | — | — | 100 |
| | Component (B) | B1 | — | 25 | 13 | — | 25 | 13 |
| | | B2 | — | 10 | — | — | 10 | — |
| | | B3 | 20 | — | 5 | 20 | — | 5 |
| | Component (C) | C1 | — | 0.5 | — | — | 0.5 | — |
| | | C2 | 9 | 4 | — | 9 | 4 | — |
| | | C3 | — | — | 2 | — | — | 2 |
| | Component (D) | D7 | 1 | 0.5 | 0.3 | — | — | — |
| | Component (E) | E1 | 0.3 | 0.3 | 0.3 | 0.3 | 0.3 | 0.3 |
| | Component (H) | H1 | 1 | — | — | 1 | — | — |
| | Component (I) | I1 | — | 2 | 2 | — | 2 | 2 |
| | Component (J) | J1 | 200 | — | — | 200 | — | — |
| | | J3 | — | 200 | 200 | — | 200 | 200 |
| Exposure dose(mJ/cm$^2$) | | | 800 | 600 | 400 | 500 | 600 | 400 |
| Evaluation | Resolution | | A | A | A | B | C | C |
| | Aspect ratio | | 1.34 | 1.34 | 1.42 | 1.04 | 1.04 | 0.71 |

Examples 28 and 29, and Comparative Examples 11 and 12

[Preparation of Photosensitive Resin Composition]

The photosensitive resin compositions of Examples 28 and 29, and Comparative Examples 11 and 12 were prepared by using the components in the amounts shown in Table 6. The blending amount of Table 61 is indicated in parts by mass of each component based on 100 parts by mass of the component (A).

[Production of Patterned Resin Film]

The obtained photosensitive resin composition was spin-coated on a silicon wafer using Act8, dried at 100° C. for 2 minutes, and then dried at 110° C. for 2 minutes to form a photosensitive resin film having a dry film thickness of 12 to 15 μm.

The development time was set to twice the time required to completely dissolve the obtained photosensitive resin film by immersion in cyclopontanone.

In addition, a photosensitive resin film was produced in the same manner as described above, and the obtained photosensitive resin film was exposed by irradiating through a photomask for forming via holes with a radius of 1 μm to 100 μm at an exposure dose shown in Table 6 using FPA-3000iW.

Using Act8, post-exposure bake of the resin film was performed at 120° C. for 3 minutes under atmospheric conditions.

The resin film after the post-exposure bake was paddle-developed in cyclopentanone using Act8 for the above development time, and then rinsed with PGMEA to obtain a patterned resin film.

[Production of Patterned Cured Product]

The obtained patterned resin film was heated at 175° C. for 1 hour in a nitrogen atmosphere using μ-TF to obtain a patterned cured product (film thickness after curing: 10 μm).

[Evaluation of Resolution]

The resolution of the obtained patterned cured product was evaluated in the same manner as in Examples 25 to 27 and Comparative Examples 8 to 10.

The results are shown in Table 6.

[Evaluation of Aspect Ratio]

The aspect ratio of the obtained patterned cured product was calculated in the same manner as in Examples 1 to 24 and Comparative Examples 1 to 7.

The results are shown in Table 6.

TABLE 6

| | | | Example | | Comp. Ex. | |
|---|---|---|---|---|---|---|
| | | | 28 | 29 | 11 | 12 |
| Photosensitive resin composition | Component (A) | A1 | — | 100 | — | 100 |
| | | A3 | 100 | — | 100 | — |
| | Component (B) | B1 | — | 25 | — | 25 |
| | | B2 | — | 10 | — | 10 |
| | | B3 | 20 | — | 20 | — |
| | | B4 | 15 | — | 15 | — |
| | Component (C) | C1 | 0.2 | 0.2 | 0.2 | 0.2 |
| | | C2 | 2 | 5 | 2 | 5 |
| | Component (D) | D7 | 1 | 1 | — | — |
| | Component (E) | E1 | 0.3 | 0.3 | 0.3 | 0.3 |
| | Component (H) | H1 | 0.4 | — | 0.4 | — |
| | Component (I) | I1 | — | 2 | — | 2 |
| | Component (J) | J2 | — | 200 | — | 200 |
| | | J3 | 200 | — | 200 | — |
| Exposure dose(mJ/$cm^2$) | | | 800 | 1000 | 800 | 1000 |
| Evaluation | Resolution | | A | A | B | B |
| | Aspect ratio | | 1.76 | 2.08 | 1.04 | 0.98 |

INDUSTRIAL APPLICABILITY

The photosensitive resin composition of the invention can be used for an interlayer insulating film, a cover coat layer, a surface protective film, or the like, and the interlayer insulating film, the cover coat layer, or the surface protective film of the invention can be used for an electronic component or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the application claims Paris convention priority are incorporated herein by reference in its entirety.

The invention claimed is:

1. A photosensitive resin composition comprising:

(A) a polyimide precursor having a structural unit represented by the following formula (1);

(B) a polymerizable monomer having two or more groups comprising a polymerizable unsaturated double bond;

(C) a photopolymerization initiator; and (D) one or more selected from the group consisting of 2,2',4,4'-tetrahydroxybenzophenone, 2,2'-dihydroxy-4,4'-dimethoxybenzophenone, 4-[ethyl (2-hydroxyethyl) amino]-4'-nitroazobenzene, (1E,6E)-1,7-bis(4-hydroxy-3-methoxyphenyl)-1,6-heptadiene-3,5-dione, and 1,7-bis(4-hydroxyphenyl)-1,6-heptadiene-3,5-dione:

(1)

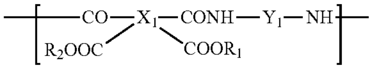

wherein in the formula (1), $X_1$ is a tetravalent group having one or more aromatic groups; a —$COOR_1$ group and a —CONH— group are on the ortho-position to each other; a —$COOR_2$ group and a —CO— group are on the ortho-position to each other; $Y_1$ is a divalent group having one or more aromatic groups; $R_1$ and $R_2$ are independently a hydrogen atom, a group represented by the following formula (2), or an aliphatic hydrocarbon group including 1 to 4 carbon atoms; provided that at least one of $R_1$ and $R_2$ is the group represented by the formula (2):

(2)

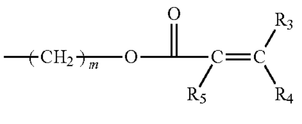

wherein in the formula (2), $R_3$ to $R_5$ are independently a hydrogen atom or an aliphatic hydrocarbon group including 1 to 3 carbon atoms; and m is an integer of 1 to 10.

2. The photosensitive resin composition according to claim 1, wherein the polymerizable monomer has an aliphatic cyclic skeleton.

3. The photosensitive resin composition according to claim 1, wherein the component (B) comprises a polymerizable monomer represented by the following formula (3):

(3)

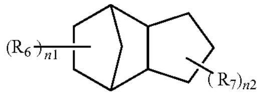

wherein in the formula (3), $R_6$ and $R_7$ are independently an aliphatic hydrocarbon group including 1 to 4 carbon atoms, or a group represented by the following formula (4); n1 is 0 or 1; n2 is an integer of 0 to 2; provided that n1+n2 is 1 or more; and at least one of the n1 $R_6$'s and the n2 $R_7$'s is a group represented by the following formula (4):

(4)

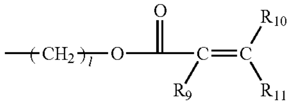

wherein in the formula (4), $R_9$ to $R_{11}$ are independently a hydrogen atom, or an aliphatic hydrocarbon group including 1 to 3 carbon atoms; and I is an integer of 0 to 10.

4. The photosensitive resin composition according to claim 3, wherein n1+n2 is 2 or 3.

5. The photosensitive resin composition according to claim 1, wherein the component (B) comprises a polymerizable monomer represented by the following formula (5):

(5)

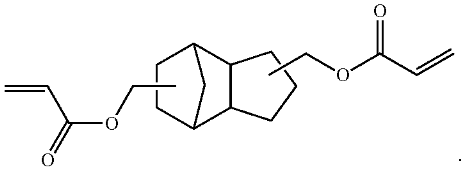

.

6. The photosensitive resin composition according to claim 1, further comprising (I) a thermal polymerization initiator.

7. The photosensitive resin composition according to claim 1, wherein the component (D) comprises at least (1E,6E)-1,7-bis(4-hydroxy-3-methoxyphenyl)-1,6-heptadiene-3,5-dione.

8. The photosensitive resin composition according to claim 1, wherein $Y_1$ is a divalent group represented by the following formula (7):

(7)

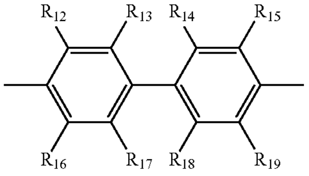

wherein in the formula (7), $R_{12}$ to $R_{19}$ are independently a hydrogen atom, a monovalent aliphatic hydrocarbon group, or a monovalent organic group having a halogen atom.

9. The photosensitive resin composition according to claim 8, wherein $R_{12}$ to $R_{19}$ are independently a hydrogen atom, or a monovalent aliphatic hydrocarbon group.

10. The photosensitive resin composition according to claim 1, further comprising (E) a polymerization inhibitor.

11. The photosensitive resin composition according to claim 1, further comprising (H) a sensitizer.

12. A photosensitive resin composition comprising:

(A) a polyimide precursor having a polymerizable unsaturated bond;

(B) a polymerizable monomer;

(C) a photopolymerization initiator; and (D) 4-[ethyl (2-hydroxyethyl)amino]-4'-nitroazobenzene.

13. A photosensitive resin composition comprising:

(A) a polyimide precursor having a polymerizable unsaturated bond;

(B) a polymerizable monomer;

(C) a photopolymerization initiator; and (D) 1,7-bis(4-hydroxyphenyl)-1,6-heptadiene-3,5-dione.

14. A method for producing a patterned cured product comprising:

applying the photosensitive resin composition according to claim 1 on a substrate, followed by drying to form a photosensitive resin film;

pattern-exposing the photosensitive resin film to obtain a resin film;

developing the resin film having undergone the pattern exposure using an organic solvent to obtain a patterned resin film; and heat-treating the patterned resin film.

15. The method for producing the patterned cured product according to claim 14, wherein a temperature of the heat treatment is 200° C. or lower.

16. A cured product obtained by curing the photosensitive resin composition according to claim 1.

17. The cured product according to claim 16, which is a patterned cured product.

18. An interlayer insulating film, a cover coat layer, or a surface protective film manufactured by using the cured product according to claim 16.

19. An electronic component comprising the interlayer insulating film, the cover coat layer, or the surface protective film according to claim 18.

* * * * *